United States Patent
Shi et al.

(10) Patent No.: US 11,151,946 B2
(45) Date of Patent: Oct. 19, 2021

(54) SHIFT REGISTER UNIT AND DRIVING METHOD, GATE DRIVING CIRCUIT, AND DISPLAY DEVICE

(71) Applicant: BOE TECHNOLOGY GROUP CO., LTD., Beijing (CN)

(72) Inventors: Lubin Shi, Beijing (CN); Xiaohai Chen, Beijing (CN); Tingting Zhou, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/641,970

(22) PCT Filed: Jan. 4, 2019

(86) PCT No.: PCT/CN2019/070499
§ 371 (c)(1),
(2) Date: Feb. 25, 2020

(87) PCT Pub. No.: WO2020/140292
PCT Pub. Date: Jul. 9, 2020

(65) Prior Publication Data
US 2021/0150989 A1    May 20, 2021

(51) Int. Cl.
*G09G 3/3275* (2016.01)
*G09G 3/3266* (2016.01)
*G11C 19/28* (2006.01)

(52) U.S. Cl.
CPC ......... *G09G 3/3275* (2013.01); *G09G 3/3266* (2013.01); *G11C 19/28* (2013.01); *G09G 2310/0286* (2013.01)

(58) Field of Classification Search
CPC .............. G09G 3/3275; G09G 3/3266; G09G 2310/0286; G11C 19/28
See application file for complete search history.

(56) References Cited

U.S. PATENT DOCUMENTS

| 8,718,225 | B2 | 5/2014 | Jang et al. |
| 10,467,966 | B2 | 11/2019 | Ma |
| 2006/0044247 | A1 | 3/2006 | Jang et al. |

(Continued)

FOREIGN PATENT DOCUMENTS

| CN | 101887757 A | 11/2010 |
| CN | 102750987 A | 10/2012 |

(Continued)

*Primary Examiner* — Premal R Patel

(57) ABSTRACT

A shift register unit and a driving method, a gate driving circuit, and a display device are provided. The shift register unit includes an input terminal, a first shift register sub-unit, and a second shift register sub-unit. The first shift register sub-unit includes a first output terminal, is connected to the input terminal to receive an input signal, and is configured to output a first output signal at the first output terminal according to the input signal; the second shift register sub-unit includes a second output terminal, is connected to the input terminal to receive the input signal, and is configured to output a second output signal at the second output terminal according to the input signal; and a pulse portion of the first output signal at least partially overlaps with a pulse portion of the second output signal in time.

19 Claims, 6 Drawing Sheets

(56) References Cited

U.S. PATENT DOCUMENTS

| | | | |
|---|---|---|---|
| 2012/0081409 A1* | 4/2012 | Chung | G09G 3/3677 345/690 |
| 2015/0015554 A1* | 1/2015 | Kim | G09G 3/3208 345/208 |
| 2016/0133185 A1* | 5/2016 | Yoon | G09G 3/3233 345/76 |
| 2017/0116924 A1* | 4/2017 | Zhang | G09G 3/3266 |
| 2017/0186360 A1* | 6/2017 | Ma | H01L 27/3244 |
| 2017/0206824 A1* | 7/2017 | Sun | G09G 3/3266 |
| 2017/0243534 A1* | 8/2017 | Zhang | G09G 3/3225 |
| 2019/0130846 A1* | 5/2019 | Chung | G09G 3/3266 |

FOREIGN PATENT DOCUMENTS

| | | |
|---|---|---|
| CN | 102760406 A | 10/2012 |
| CN | 105427790 A | 3/2016 |
| CN | 105139801 A | 6/2017 |
| EP | 2874140 B1 | 5/2015 |

\* cited by examiner

SHIFT REGISTER UNIT AND DRIVING METHOD, GATE DRIVING CIRCUIT, AND DISPLAY DEVICE

TECHNICAL FIELD

The embodiments of the present disclosure relate to a shift register unit, a driving method, a gate driving circuit, and a display device.

BACKGROUND

In a field of display technology, for example, a pixel array of a liquid crystal display panel or an organic light-emitting diode (OLED) display panel generally comprises a plurality of rows of gate lines and a plurality of columns of data lines, and the plurality of rows of gate lines are interlaced with the plurality of columns of data lines. The driving of the gate lines can be achieved by a bonded integrated driving circuit. In recent years, with continuous improvement of a preparation process of amorphous silicon thin film transistors or oxide thin film transistors, the gate driving circuit can also be directly integrated on a thin film transistor array substrate to form a GOA (Gate-driver On Array) to drive the gate lines. For example, a GOA including a plurality of cascaded shift register units may be used to provide on-off state voltage signals (scan signals) for the plurality of rows of gate lines of the pixel array, thereby, for example, controlling the plurality of rows of gate lines to be sequentially turned on, and at the same time, data signals are provided to pixel units in a corresponding row in the pixel array through the data lines, therefore, gray voltages required for respective gray scales of a display image in respective pixel units are generated, furthermore a frame image is displayed. Currently, the display panel increasingly adopt GOA technology to drive the gate lines. The GOA technology is conducive to achieving a narrow frame of the display panel and reducing production costs of the display panel.

SUMMARY

At least one embodiment of the present disclosure provides a shift register unit, comprising an input terminal, a first shift register sub-unit, and a second shift register sub-unit. The first shift register sub-unit comprises a first output terminal and is connected to the input terminal to receive an input signal, and the first shift register sub-unit is configured to output a first output signal at the first output terminal according to the input signal; the second shift register sub-unit comprises a second output terminal and is connected to the input terminal to receive the input signal, and the second shift register sub-unit is configured to output a second output signal at the second output terminal according to the input signal; and a pulse portion of the first output signal at least partially overlaps with a pulse portion of the second output signal in time.

For example, in the shift register unit provided by an embodiment of the present disclosure, the first shift register sub-unit comprises a first input circuit and a first output circuit. The first input circuit is connected to the input terminal and a first node, and is configured to input the input signal to the first node in response to a first clock signal; and the first output circuit is connected to the first node and the first output terminal, and is configured to output the first output signal to the first output terminal under control of a level of the first node.

For example, in the shift register unit provided by an embodiment of the present disclosure, the first input circuit comprises a first input transistor, a gate electrode of the first input transistor is connected to a first clock signal terminal to receive the first clock signal, a first electrode of the first input transistor is connected to the input terminal to receive the input signal, and a second electrode of the first input transistor is connected to the first node; and the first output circuit comprises a first output transistor and a first storage capacitor, a gate electrode of the first output transistor is connected to a third node, a first electrode of the first output transistor is connected to the first output terminal, and a second electrode of the first output transistor is connected to a second clock signal terminal to receive a second clock signal; and a first terminal of the first storage capacitor is connected to the gate electrode of the first output transistor, and a second terminal of the first storage capacitor is connected to the first electrode of the first output transistor.

For example, in the shift register unit provided by an embodiment of the present disclosure, the first shift register sub-unit further comprises a first control circuit and an output noise reduction circuit; the first control circuit is connected to a second node, and is configured to control a level of the second node in response to the level of the first node and the first clock signal; and the output noise reduction circuit is connected to the first output terminal, and is configured to perform noise reduction on the first output terminal under control of the level of the second node.

For example, in the shift register unit provided by an embodiment of the present disclosure, the first control circuit comprises a first transistor and a second transistor; a gate electrode of the first transistor is connected to the first node, a first electrode of the first transistor is connected to a first clock signal terminal to receive the first clock signal, and a second electrode of the first transistor is connected to the second node; and a gate electrode of the second transistor is connected to the first clock signal terminal to receive the first clock signal, a first electrode of the second transistor is connected to a first voltage terminal to receive a first voltage, and a second electrode of the second transistors is connected to the second node.

For example, in the shift register unit provided by an embodiment of the present disclosure, the output noise reduction circuit comprises a third transistor and a first capacitor; a gate electrode of the third transistor is connected to the second node, a first electrode of the third transistor is connected to a second voltage terminal to receive a second voltage, and a second electrode of the third transistor is connected to the first output terminal; and a first terminal of the first capacitor is connected to the second node, and a second terminal of the first capacitor is connected to the first electrode of the third transistor.

For example, in the shift register unit provided by an embodiment of the present disclosure, the first shift register sub-unit further comprises a first node noise reduction circuit. The first node noise reduction circuit is connected to the first node and the second node, and is configured to perform noise reduction on the first node under control of the level of the second node and a second clock signal.

For example, in the shift register unit provided by an embodiment of the present disclosure, the first node noise reduction circuit comprises a fourth transistor and a fifth transistor. A gate electrode of the fourth transistor is connected to the second node, a first electrode of the fourth transistor is connected to a second voltage terminal to receive a second voltage, and a second electrode of the fourth transistor is connected to a first electrode of the fifth transistor; and a gate electrode of the fifth transistor is connected to a second clock signal terminal to receive the second clock signal, and a second electrode of the fifth transistor is connected to the first node.

For example, in the shift register unit provided by an embodiment of the present disclosure, the first shift register sub-unit further comprises a voltage stabilization circuit. The voltage stabilization circuit is connected to the first node and a third node, and is configured to stabilize a level of the third node; and the first output circuit is connected to the third node, and is configured to output the first output signal to the first output terminal under control of the level of the third node.

For example, in the shift register unit provided by an embodiment of the present disclosure, the voltage stabilization circuit comprises a sixth transistor. A gate electrode of the sixth transistor is connected to a first voltage terminal to receive a first voltage, a first electrode of the sixth transistor is connected to the first node, and a second electrode of the sixth transistor is connected to the third node.

For example, in the shift register unit provided by an embodiment of the present disclosure, the second shift register sub-unit comprises a second input circuit, a second output circuit, a second control circuit, and an output reset circuit; the second input circuit is connected to the input terminal and a fourth node, and is configured to input the input signal to the fourth node in response to a first clock signal; the second output circuit is connected to the fourth node and the second output terminal, and is configured to output the second output signal to the second output terminal under control of a level of the fourth node; the second control circuit is connected to the fourth node and a fifth node, and is configured to control a level of the fifth node in response to the level of the fourth node and a third clock signal; and the output reset circuit is connected to the fifth node, and is configured to reset the second output terminal under control of the level of the fifth node.

For example, in the shift register unit provided by an embodiment of the present disclosure, the second input circuit comprises a second input transistor, a gate electrode of the second input transistor is connected to a first clock signal terminal to receive the first clock signal, a first electrode of the second input transistor is connected to the input terminal to receive the input signal, and a second electrode of the second input transistor is connected to the fourth node; the second output circuit comprises a second output transistor and a second storage capacitor, a gate electrode of the second output transistor is connected to the fourth node, a first electrode of the second output transistor is connected to a second voltage terminal to receive a second voltage, and a second electrode of the second output transistor is connected to the second output terminal; and a first terminal of the second storage capacitor is connected to the gate electrode of the second output transistor, and a second terminal of the second storage capacitor is connected to the first electrode of the second output transistor.

For example, in the shift register unit provided by an embodiment of the present disclosure, the second control circuit comprises a seventh transistor and an eighth transistor; a gate electrode of the seventh transistor is connected to the fourth node, a first electrode of the seventh transistor is connected to a second voltage terminal to receive a second voltage, and a second electrode of the seventh transistor is connected to the fifth node; and a gate electrode of the eighth transistor is connected to a third clock signal terminal to receive the third clock signal, a first electrode of the eighth transistor is connected to a first voltage terminal to receive a first voltage, and a second electrode of the eighth transistor is connected to the fifth node.

For example, in the shift register unit provided by an embodiment of the present disclosure, the output reset circuit comprises a ninth transistor and a second capacitor; a gate electrode of the ninth transistor is connected to the fifth node, a first electrode of the ninth transistor is connected to the second output terminal, and a second electrode of the ninth transistor is connected to a first voltage terminal to receive a first voltage; and a first terminal of the second capacitor is connected to the fifth node, and a second terminal of the second capacitor is connected to the first electrode of the ninth transistor.

For example, in the shift register unit provided by an embodiment of the present disclosure, the second shift register sub-unit further comprises a third control circuit; the third control circuit is connected to the fourth node and the fifth node, and is configured to control the level of the fourth node under control of the level of the fifth node.

For example, in the shift register unit provided by an embodiment of the present disclosure, the third control circuit comprises a tenth transistor. A gate electrode of the tenth transistor is connected to the fifth node, a first electrode of the tenth transistor is connected to a second voltage terminal to receive a second voltage, and a second electrode of the tenth transistor is connected to the fourth node.

For example, in the shift register unit provided by an embodiment of the present disclosure, the first shift register sub-unit comprises a first input circuit, a first output circuit, a first control circuit, an output noise reduction circuit, a first node noise reduction circuit, and a voltage stabilization circuit, and the second shift register sub-unit comprises a second input circuit, a second output circuit, a second control circuit, an output reset circuit, and a third control circuit; the first input circuit comprises a first input transistor, a gate electrode of the first input transistor is connected to a first clock signal terminal to receive the first clock signal, a first electrode of the first input transistor is connected to the input terminal to receive the input signal, and a second electrode of the first input transistor is connected to the first node; the first output circuit comprises a first output transistor and a first storage capacitor, a gate electrode of the first output transistor is connected to a third node, a first electrode of the first output transistor is connected to the first output terminal, and a second electrode of the first output transistor is connected to a second clock signal terminal to receive a second clock signal; a first terminal of the first storage capacitor is connected to the gate electrode of the first output transistor, and a second terminal of the first storage capacitor is connected to the first electrode of the first output transistor; the first control circuit comprises a first transistor and a second transistor, a gate electrode of the first transistor is connected to the first node, a first electrode of the first transistor is connected to the first clock signal terminal to receive the first clock signal, and a second electrode of the first transistor is connected to a second node; a gate electrode of the second transistor is connected to the first clock signal terminal to receive the first clock signal, a first electrode of the second transistor is connected to a first voltage terminal to receive a first voltage, and a second electrode of the second transistor is connected to the second node; the output noise reduction circuit comprises a third transistor and a first capacitor, a gate electrode of the third transistor is connected to the second node, a first electrode of the third transistor is connected to a second voltage terminal to receive a second voltage, and a second electrode of the third transistor is connected to the first output terminal; a first terminal of the first capacitor is connected to the second node, and a second terminal of the first capacitor is connected to the first electrode of the third transistor; the first node noise reduction circuit comprises a fourth transistor and a fifth transistor, a gate electrode of the fourth transistor is connected to the second node, a first electrode of the fourth transistor is connected to the second voltage terminal to receive the second voltage, and a second electrode of the fourth transistor is connected to a first electrode of the fifth transistor; a gate electrode of the fifth transistor is connected to the second clock signal terminal to receive the second clock signal, and a second electrode of the fifth transistor is connected to the first node; the voltage stabilization circuit comprises a sixth transistor, a gate electrode of the sixth transistor is connected to the first voltage terminal to receive the first voltage, a first electrode of the sixth transistor is connected to the first node, and a second electrode of the sixth transistor is connected to the third node; the second input circuit comprises a second input transistor, a gate electrode of the second input transistor is connected to the first clock signal terminal to receive the first clock signal, a first electrode of the second input transistor is connected to the input terminal to receive the input signal, and a second electrode of the second input transistor is connected to a fourth node; the second output circuit comprises a second output transistor and a second storage capacitor, a gate electrode of the second output transistor is connected to the fourth node, a first electrode of the second output transistor is connected to the second voltage terminal to receive the second voltage, and a second electrode of the second output transistor is connected to the second output terminal; a first terminal of the second storage capacitor is connected to the gate electrode of the second output transistor, and a second terminal of the second storage capacitor is connected to the first electrode of the second output transistor; the second control circuit comprises a seventh transistor and an eighth transistor, a gate electrode of the seventh transistor is connected to the fourth node, a first electrode of the seventh transistor is connected to the second voltage terminal to receive the second voltage, and a second electrode of the seventh transistor is connected to a fifth node; a gate electrode of the eighth transistor is connected to a third clock signal terminal to receive a third clock signal, a first electrode of the eighth transistor is connected to the first voltage terminal to receive the first voltage, and a second electrode of the eighth transistor is connected to the fifth node; the output reset circuit comprises a ninth transistor and a second capacitor, a gate electrode of the ninth transistor is connected to the fifth node, a first electrode of the ninth transistor is connected to the second output terminal, and a second electrode of the ninth transistor is connected to the first voltage terminal to receive the first voltage; a first terminal of the second capacitor is connected to the fifth node, and a second terminal of the second capacitor is connected to the first electrode of the ninth transistor; and the third control circuit comprises a tenth transistor, a gate electrode of the tenth transistor is connected to the fifth node, a first electrode of the tenth transistor is connected to the second voltage terminal to receive the second voltage, and a second electrode of the tenth transistor is connected to the fourth node.

At least one embodiment of the present disclosure also provides a gate driving circuit including a plurality of cascaded shift register units provided by any one of the embodiments of the present disclosure. Except for a first stage of shift register unit, an input terminal of each stage of shift register unit, other than the first stage of shift register unit, is connected to a first output terminal of a previous stage of shift register unit.

For example, the gate driving circuit provided by an embodiment of the present disclosure further comprises a first clock signal line, a second clock signal line, and a third clock signal line, each of the shift register units further includes a first clock signal terminal, a second clock signal terminal, and a third clock signal terminal. A first clock signal terminal of a (3N+1)-th stage of shift register unit is connected to the first clock signal line, a second clock signal terminal of the (3N+1)-th stage of shift register unit is connected to the second clock signal line, and a third clock signal terminal of the (3N+1)-th stage of shift register unit is connected to the third clock signal line; a first clock signal terminal of a (3N+2)-th stage of shift register unit is connected to the second clock signal line, a second clock signal terminal of the (3N+2)-th stage of shift register unit is connected to the third clock signal line, and a third clock signal terminal of the (3N+2)-th stage of shift register unit is connected to the first clock signal line; a first clock signal terminal of a (3N+3)-th stage of shift register unit is connected to the third clock signal line, a second clock signal terminal of the (3N+3)-th stage of shift register unit is connected to the first clock signal line, and a third clock signal terminal of the (3N+3)-th stage of shift register unit is connected to the second clock signal line; and N is an integer greater than or equal to 0.

At least one embodiment of the present disclosure also provides a display device including the gate driving circuit provided by any one of the embodiments of the present disclosure.

For example, the display device provided by an embodiment of the present disclosure further includes a plurality of pixel units arranged in an array, each of the pixel units comprises a pixel circuit, the pixel circuit comprises a data writing sub-circuit, a driving sub-circuit, and a light-emitting control sub-circuit; a first output terminal of a shift register unit corresponding to the pixel circuit is connected to a control terminal of the data writing sub-circuit, and a second output terminal of the shift register unit corresponding to the pixel circuit is connected to a control terminal of the light-emitting control sub-circuit.

At least one embodiment of the present disclosure further provides a driving method for driving a shift register unit, including: in response to the input signal, by the first shift register sub-unit, outputting the first output signal at the first output terminal; and in response to the input signal, by the second shift register sub-unit, outputting the second output signal at the second output terminal.

BRIEF DESCRIPTION OF THE DRAWINGS

In order to clearly illustrate the technical solutions of the embodiments of the disclosure, the drawings of the embodiments will be briefly described in the following; it is obvious that the described drawings are only related to some embodiments of the disclosure and thus are not limitative to the disclosure.

DETAILED DESCRIPTION

In order to make objects, technical details and advantages of the embodiments of the disclosure apparent, the technical solutions of the embodiments will be described in a clearly and fully understandable way in connection with the drawings related to the embodiments of the disclosure. Apparently, the described embodiments are just a part but not all of the embodiments of the disclosure. Based on the described embodiments herein, those skilled in the art can obtain other embodiment(s), without any inventive work, which should be within the scope of the disclosure.

Unless otherwise defined, all the technical and scientific terms used herein have the same meanings as commonly understood by one of ordinary skill in the art to which the present disclosure belongs. The terms "first," "second," etc., which are used in the present disclosure, are not intended to indicate any sequence, amount or importance, but distinguish various components. The terms "comprise," "comprising," "include," "including," etc., are intended to specify that the elements or the objects stated before these terms encompass the elements or the objects and equivalents thereof listed after these terms, but do not preclude the other elements or objects. The phrases "connect", "connected", etc., are not intended to define a physical connection or mechanical connection, but may include an electrical connection, directly or indirectly. "On," "under," "right," "left" and the like are only used to indicate relative position relationship, and when the position of the object which is described is changed, the relative position relationship may be changed accordingly.

Figure 1:
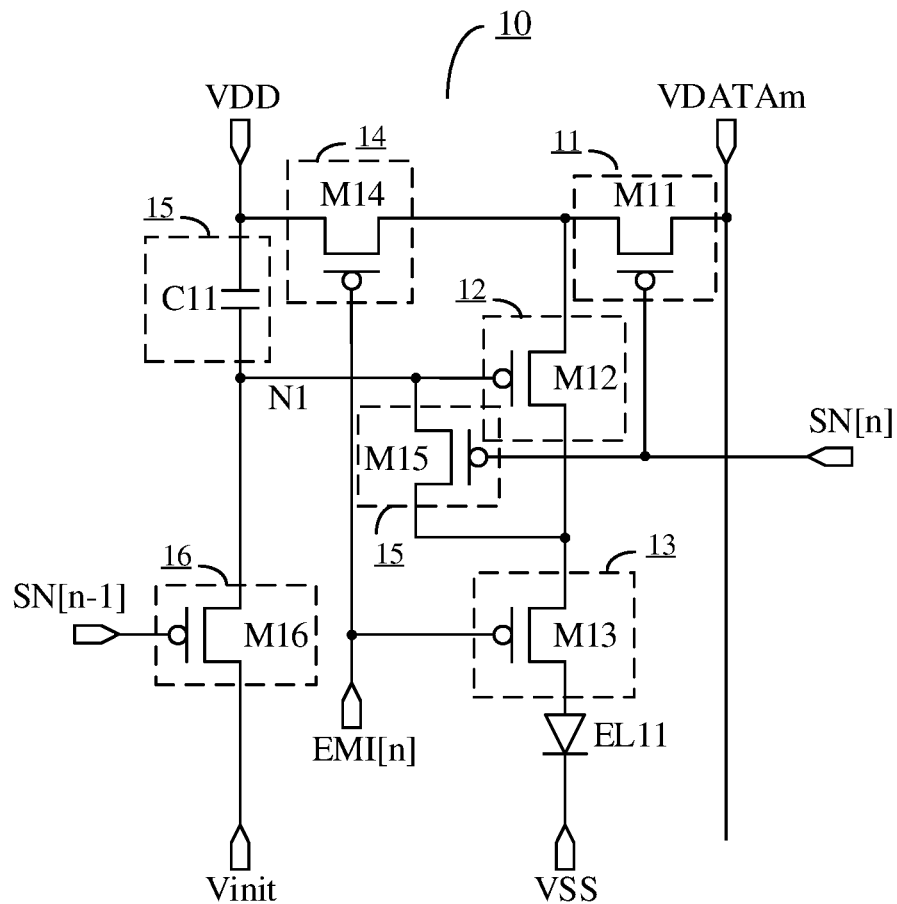
FIG. 1 is a schematic diagram of a circuit structure of a pixel circuit.

FIG. 1 is a structural schematic diagram of a pixel circuit. As shown in FIG. 1, the pixel circuit 10 includes a data writing sub-circuit 11, a driving sub-circuit 12, a light-emitting control sub-circuit 13, a switching sub-circuit 14, an initialization sub-circuit 16, a light-emitting element EL11, and a compensation sub-circuit 15.

For example, the data writing sub-circuit 11 is configured to write a data signal VDATAm to the driving sub-circuit 12 in response to a first scan signal SN[n] (n is an integer greater than 1); the driving sub-circuit 12 is configured to control a driving current that drives the light-emitting element EL11 to emit light; the light-emitting control sub-circuit 13 is configured to transmit the driving current provided by the driving sub-circuit 12 to the light-emitting element EL11 in response to a light-emitting control signal EMI[n]; the light-emitting element EL11 is configured to emit light of a corresponding intensity in response to the driving current; the compensation sub-circuit 15 is configured to store the data signal written by the data writing sub-circuit 11 and compensate the driving sub-circuit 12 in response to the first scan signal SN[n]; the switching sub-circuit 14 is configured to provide a first power voltage VDD to the driving sub-circuit 12 in response to the light-emitting control signal EMI[n]; and the initialization sub-circuit 16 is configured to initialize the driving sub-circuit 12 and the compensation sub-circuit 15 in response to a second scan signal SN[n−1]. For example, a gate line providing the first scan signal SN[n] may be connected to the data writing sub-circuits 11 and the compensation sub-circuits 15 of pixel circuits in an n-th row; and a gate line providing the second scan signal SN[n−1] may be connected to the data writing sub-circuits 11 and the compensation sub-circuits 15 of pixel circuits in an (n−1)-th row, and may also be connected to the initialization sub-circuits 16 of the pixel circuits in the n-th row.

As shown in FIG. 1, the data writing sub-circuit 11 may be implemented as a data writing transistor M11; the driving sub-circuit 12 may be implemented as a driving transistor M12; the light-emitting control sub-circuit 13 may be implemented as a light-emitting control transistor M13; the compensation sub-circuit 15 may be implemented as a compensation transistor M15 and a storage capacitor C11; the switching sub-circuit 14 may be implemented as a switching transistor M14; and the initialization sub-circuit 16 may be implemented as an initialization transistor M16. It should be noted that, the following description is described by taking a case that each transistor is a P-type transistor as an example.

Figure 2:
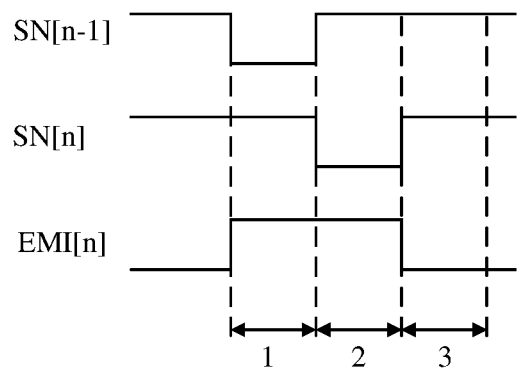
FIG. 2 is a timing chart of control signals corresponding to the pixel circuit as shown in FIG. 1.

The working principle of the pixel circuit 10 as shown in FIG. 1 will be described below with reference to the timing diagram of the control signals as shown in FIG. 2. For example, the working principle of the pixel circuit 10 includes the following steps.

In an initialization phase 1, the second scan signal SN[n−1] is at a low level, and the first scan signal SN[n] and the light-emitting control signal EMI[n] are at a high level. For example, the data writing transistor M11 and the compensation transistor M15 are turned off by the high level of the first scan signal SN[n], the light-emitting control transistor M13 and the switching transistor M14 are turned off by the high level of the light-emitting control signal EMI[n], the initialization transistor M16 is turned on by the low level of the second scan signal SN[n−1], so that the first node N1 is connected to an initialization voltage terminal Vinit to receive an initialization voltage, and therefore, in this phase, the data signal stored in the storage capacitor C11 and the gate voltage of the driving transistor M12 can be initialized.

In a programming phase 2, the second scan signal SN[n−1] is at a high level, the first scan signal SN[n] is at a low level, and the light-emitting control signal EMI[n] is at a high level. For example, the initialization transistor M16 is turned off by the high level of the second scan signal SN[n−1], the light-emitting control transistor M13 and the switching transistor M14 are turned off by the high level of the light-emitting control signal EMI[n], the data writing transistor M11 and the compensation transistor M15 are turned on by the low level of the first scan signal SN[n], so that the data signal charges the gate electrode of the driving transistor M12 through the data writing transistor M11 and the compensation transistor M15. According to the characteristics of the compensation transistor M15, in a case where the voltage of the gate electrode of the driving transistor M12 is charged to VDATAm-VTH (M12), the driving transistor M12 is turned off, and the charging process ends.

In a light-emitting phase 3, the second scan signal SN[n−1] and the first scan signal SN[n] are at a high level, and the light-emitting control signal EMI[n] is at a low level. The initialization transistor M16 is turned off by the high level of the first scan signal SN[n−1], the data writing transistor M11 and the compensation transistor M15 are turned off by the high level of the first scan signal SN[n], and the light-emitting control transistor M13 and the switching transistor M14 are turned on by the low level of the light-emitting control signal EMI[n]. At this time, a driving current generated in response to a voltage signal VDATAm-VTH (M12) applied to the gate electrode of the driving transistor M12 is supplied to the light-emitting element EL11 through the driving transistor M12, so as to cause the light-emitting element EL11 to emit light.

For example, in a common OLED display panel, row driving signals such as the first scan signal SN[n], the second scan signal SN[n−1], and the light-emitting control signal EMI[n], which are used to drive, for example, the light-emitting element in the pixel circuit described above to emit light, are generally driven separately. For example, the first scan signal SN[n] and the second scan signal SN[n−1] may be provided by a gate driving circuit, and a light-emitting control signal EMI[n] may be provided by a light-emitting control circuit. However, this driving method will cause the wiring of the display panel to be complicated and the number of transistors to be large, which is not conducive to achieving the display panel with a narrow frame.

At least one embodiment of the present disclosure provides a shift register unit, and the shift register unit includes an input terminal, a first shift register sub-unit, and a second shift register sub-unit. The first shift register sub-unit comprises a first output terminal and is connected to the input terminal to receive an input signal, and the first shift register sub-unit is configured to output a first output signal at the first output terminal according to the input signal; the second shift register sub-unit comprises a second output terminal and is connected to the input terminal to receive the input signal, and the second shift register sub-unit is configured to output a second output signal at the second output terminal according to the input signal; and a pulse portion of the first output signal at least partially overlaps with a pulse portion of the second output signal in time.

Some embodiments of the present disclosure also provide a gate driving circuit, a display device, and a driving method corresponding to the above-mentioned shift register unit.

The shift register unit provided by some embodiments of the present disclosure can achieve a common output of a plurality of row driving signals such as a scan signal and a light-emitting control signal, which can be conducive to reducing the number of thin film transistors and improving the stability of the gate driving circuit including the shift register units, and achieving the narrow frame design of the display panel.

Hereinafter, several embodiments of the present disclosure will be described in detail with reference to the accompanying drawings. It should be noted that, in order to keep the description of the embodiments of the present disclosure clear and brief, detailed descriptions of known functions and known components (elements) may be omitted. In a case where any component (element) of an embodiment of the present disclosure appears in more than one drawing, the component (element) is indicated by the same or similar reference numeral in each drawing.

Figure 3:
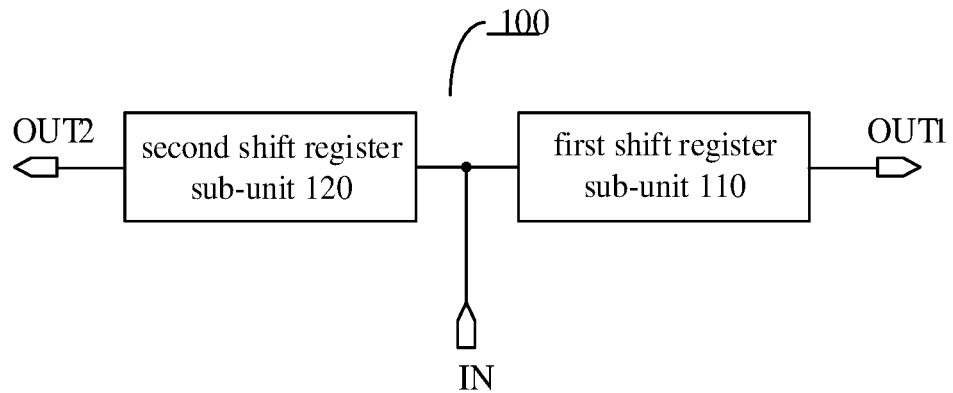
FIG. 3 is a schematic block diagram of a shift register unit provided by some embodiments of the present disclosure.

FIG. 3 is a schematic block diagram of a shift register unit according to some embodiments of the present disclosure. As shown in FIG. 3, the shift register unit 100 includes an input terminal IN, a first shift register sub-unit 110, and a second shift register sub-unit 120. The shift register unit 100 can respectively output a first output signal at the first output terminal OUT1 and a second output signal at the second output terminal OUT2 according to an input signal provided by the input terminal IN.

For example, a gate driving circuit can be obtained by cascading a plurality of the shift register units 100, and the gate driving circuit can be used to drive, for example, a liquid crystal display panel, an organic light-emitting diode display panel, and the like. For example, in a case of driving the organic light-emitting diode display panel including the above pixel circuit 10 for display, the gate driving circuit can provide scan signals for a plurality of gate lines and provide light-emitting control signals for a plurality of light-emitting control lines of the organic light-emitting diode display panel, respectively, and therefore, when one frame of picture is displayed on the display panel, the narrow frame design of the display panel is achieved by sharing one gate driving circuit, which can output a plurality of row driving signals, such as scan signals and light-emitting control signals.

As shown in FIG. 3, the first shift register sub-unit 110 includes a first output terminal OUT1 and is connected to the input terminal IN to receive the input signal. For example, the first shift register sub-unit 110 may be configured to output the first output signal at the first output terminal OUT1 according to the input signal. For example, the first output signal may be a gate scan signal, for example, the first scan signal SN[n] or the second scan signal SN[n−1] as shown in FIG. 2.

For example, the second shift register sub-unit 120 includes a second output terminal OUT2 and is connected to the input terminal IN to receive the input signal. For example, the second shift register sub-unit 120 may be configured to output the second output signal at the second output terminal OUT2 according to the input signal. For example, the second output signal may be a light-emitting control signal such as the light-emitting control signal EMI[n] as shown in FIG. 2.

For example, a pulse portion of the first output signal at least partially overlaps with a pulse portion of the second output signal in time. For example, in some examples, as shown in FIG. 2, according to actual needs, the first output signal is the first scan signal SN[n] and includes a first level, and the first level corresponds to the pulse portion of the first output signal. For example, the first level is an active level, such as a low level, for a controlled switching element in the pixel circuit. The second output signal is the light-emitting control signal EMI[n] and includes a second level, and the second level corresponds to the pulse portion of the second output signal. For example, the second level is an inactive level, such as a high level, for the controlled switching element in the pixel circuit.

For example, as shown in FIG. 2, during a process of scanning a frame, the first output signal and the second output signal are pulse signals, the pulse portion of the first output signal corresponds to the programming phase 2 (the rest portion is a flat portion), and the pulse portion of the second output signal corresponds to the initialization phase 1 and the programming phase 2 (the rest portion is a flat portion). The first output signal remains at a first level during the entire time of the programming phase 2, and is at an inactive level during the initialization phase 1 and the light-emitting phase 3; and the second output signal remains at a second level during the entire time of the programming phase 2, is at an inactive level during the initialization phase 1, and is an active level during the light-emitting phase 3. The first level of the first output signal and the second level of the second output signal are different, and have an overlapping portion in time, for example, the first level of the first output signal can completely overlaps with the second level of the second output signal at least in the programming phase 2. For example, in other examples, the first output signal may remain at the first level during part time of the programming phase 2, the second output signal can remain at the second level during the entire time of the programming phase 2, that is, the first output signal partially overlaps with the second output signal in time during the programming phase 2, and can still normally drive the pixel circuit as shown in FIG. 1. It should be noted that the first output signal and the second output signal are not limited to the above gate scan signal and the light-emitting control signal, but may also be other driving signals for driving the display panel to emit light, and the embodiments of the present disclosure are not limited to the types of the first output signal and the second output signal.

The shift register unit provided by the above embodiments of the present disclosure can achieve to commonly output a plurality of row driving signals, such as a scan signal and a light-emitting control signal, which can be conducive to reducing the number of thin film transistors and improving the stability of the gate driving circuit composed of the shift register units, and achieving the narrow frame design of the display panel.

Figure 4:
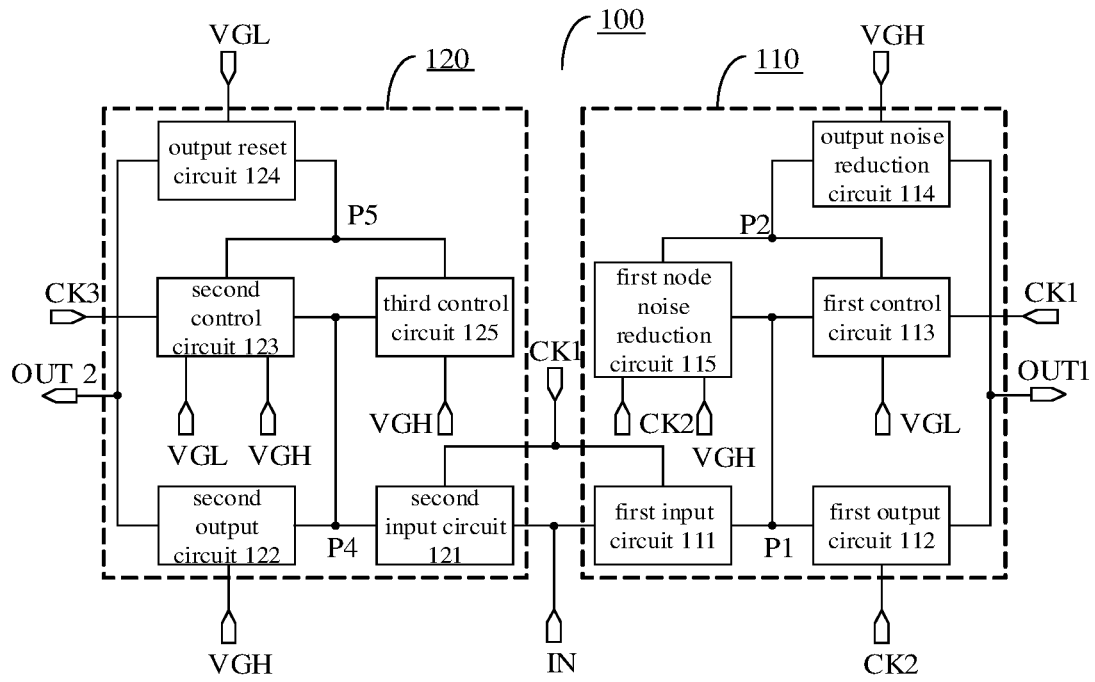
FIG. 4 is a schematic block diagram of an example of the shift register unit as shown in FIG. 3.

FIG. 4 is a schematic block diagram of an example of a shift register unit as shown in FIG. 3. For example, as shown in FIG. 4, in an example, the first shift register sub-unit 110 includes a first input circuit 111 and a first output circuit 112; and the second shift register sub-unit 120 includes a second input circuit 121, a second output circuit 122, a second control circuit 123, and an output reset circuit 124.

For example, the first input circuit 111 is connected to the input terminal IN and a first node P1, and is configured to input the input signal to the first node P1 in response to a first clock signal. For example, in some examples, the first input circuit 111 is connected to the input terminal IN, the first node P1, and a first clock signal terminal CK1, and is configured to be turned on under control of the first clock signal provided by the first clock signal terminal CK1, so that the input signal provided by the input terminal IN is transmitted to the first node P1.

For example, the first output circuit 112 is connected to the first node P1 and the first output terminal OUT1, and is configured to output the first output signal to the first output terminal OUT1 under control of a level of the first node P1. For example, in some examples, the first output circuit 112 is connected to a second clock signal terminal CK2, the first node P1, and the first output terminal OUT1, and is configured to be turned on under control of the level of the first node P1, and transmits the second clock signal provided by the second clock signal terminal CK2 to the first output terminal OUT1, and the second clock signal servers as the first output signal and is output at the first output terminal OUT1.

For example, in another example, as shown in FIG. 4, the first shift register sub-unit 110 may further include a first control circuit 113 and an output noise reduction circuit 114.

For example, the first control circuit 113 is connected to the second node P2 and is configured to control the level of the second node P2 in response to the level of the first node P1 and the first clock signal. For example, in some examples, the first control circuit 113 is connected to the first node P1, the second node P2, the first clock signal terminal CK1, and a first voltage terminal VGL (for example, a low voltage terminal) or a separately provided voltage terminal ((for example, a low voltage terminal), and is configured to be turned on under control of the level of the first node P1, so as to connect the second node P2 to the first clock signal terminal CK1, thereby transmitting the first clock signal provided by the first clock signal terminal CK1 to the second node P2; the first control circuit 113 may be further configured to be turned on under the control of the first clock signal provided by the first clock signal terminal CK1, so that the second node P2 is connected to the first voltage terminal VGL or a separately provided voltage terminal, so as to transmit the first voltage provided by the first voltage terminal VGL or a low level provided by the separately provided voltage terminal to the second node P2, thereby controlling the level of the second node P2.

For example, the output noise reduction circuit 114 is connected to the first output terminal OUT1 and is configured to perform noise reduction on the first output terminal OUT1 under control of the level of the second node P2. For example, in some examples, the output noise reduction circuit 114 is connected to the second voltage terminal VGH (for example, providing a high level) or a separately provided voltage terminal (for example, a high voltage terminal), the second node P2, and the first output terminal OUT1, and is configured to be turned on under the control of the level of the second node P2, so that the first output terminal OUT1 is connected to the second voltage terminal VGH or the separately provided voltage terminal, so as to make the first output terminal OUT1 remain to continuously output, for example, a high level, at a non-output phase, thereby achieving to perform noise reduction on the first output terminal OUT1.

For example, in another example, as shown in FIG. 4, the first shift register sub-unit 110 may further include a first node noise reduction circuit 115.

For example, the first node noise reduction circuit 115 is connected to the first node P1 and the second node P2, and is configured to perform noise reduction on the first node P1 under the control of the level of the second node P2 and the second clock signal. For example, in some embodiments, the first node noise reduction circuit 115 is connected to the first node P1, the second node P2, the second clock signal terminal CK2, and a second voltage terminal VGH or a separately provided voltage terminal (for example, a high voltage terminal), and is configured to be turned on under the common control of the level of the second node P2 and the second clock signal provided by the second clock signal terminal CK2, so that the first node P1 is connected to the second voltage terminal VGH or the separately provided voltage terminal, to keep the level of the first node P1 at a high level during the non-output phase, thereby implementing to perform noise reduction on the first node P1.

As shown in FIG. 4, the second shift register sub-unit 120 includes a second input circuit 121, a second output circuit 122, a second control circuit 123, and an output reset circuit 124.

For example, the second input circuit 121 is connected to the input terminal IN and the fourth node P4, and is configured to input the input signal to the fourth node P4 in response to the first clock signal. For example, in some examples, the second input circuit 121 is connected to the input terminal IN, the fourth node P4, and the first clock signal terminal CK1, and is configured to be turned on under control of the first clock signal provided by the first clock signal terminal CK1, thereby transmitting the input signal provided by the input terminal IN to the fourth node P4.

The second output circuit 122 is connected to the fourth node P4 and the second output terminal OUT2, and is configured to output the second output signal to the second output terminal OUT2 under control of a level of the fourth node P4. For example, in some examples, the second output circuit 122 is connected to the second voltage terminal VGH or a separately provided voltage terminal (for example, a high voltage terminal), the fourth node P4, and the second output terminal OUT2, and is configured to be turned on under the control of the level of the fourth node P4 and transmit the second voltage provided by the second voltage terminal VGH or the high level provided by the separately provided voltage terminal to the second output terminal OUT2, and the second voltage or the high level provided by the separately provided voltage terminal servers as the second output signal and is output at the second output terminal OUT2.

The second control circuit 123 is connected to the fourth node P4 and the fifth node P5, and is configured to control a level of the fifth node P5 in response to the level of the fourth node P4 and a third clock signal. For example, in some examples, the second control circuit 123 is connected to the fourth node P4, the fifth node P5, the third clock signal terminal CK3, the first voltage terminal VGL, and the second voltage terminal VGH, is configured to be turned on under the control of the level of the fourth node P4 and transmit the second voltage provided by the second voltage terminal VGH to the fifth node P5; and may also be configured to be turned on under control of the third clock signal provided by the third clock signal terminal CK3 and transmit the first voltage provided by the first voltage terminal VGL to the fifth node P5, thereby implementing to control the level of the fifth node P5.

The output reset circuit 124 is connected to the fifth node P5, and is configured to reset the second output terminal OUT2 under control of the level of the fifth node P5. For example, in some examples, the output reset circuit 124 is connected to the first voltage terminal VGL or a separately provided voltage terminal (for example, a low voltage terminal), the fifth node P5, and the second output terminal OUT2, and is configured to be turned on under the control of the level of the fifth node P5, so that the first voltage terminal VGL or the separately provided voltage terminal is connected to the second output terminal OUT2 to reset the second output terminal OUT2.

For example, in another example, as shown in FIG. 4, the second shift register sub-unit 120 may further include a third control circuit 125.

The third control circuit 125 is connected to the fourth node P4 and the fifth node P5, and is configured to control the level of the fourth node P4 under the control of the level of the fifth node P5. For example, in some examples, the third control circuit 125 is connected to the fourth node P4, the fifth node P5, and the second voltage terminal VGH or a separately provided high voltage terminal, and is configured to connect the second voltage terminal VGH or the separately provided high voltage terminal to the fourth node P4 under the control of the level of the fifth node P5, so as to pull down the level of the fourth node P4.

For example, in the embodiment of the present disclosure, the first voltage terminal VGL is configured to provide a DC low-level signal (e.g., the DC low-level signal is lower than or equal to a low level portion of a clock signal), for example, is grounded, and the DC low-level signal is referred to as a first voltage; for example, the second voltage terminal VGH is configured to provide a DC high-level signal, and the DC high-level signal is referred to as a second voltage. For example, the second voltage is greater than the first voltage, this case can be applied to the following embodiments, and similar portions are not described again.

Figure 5:
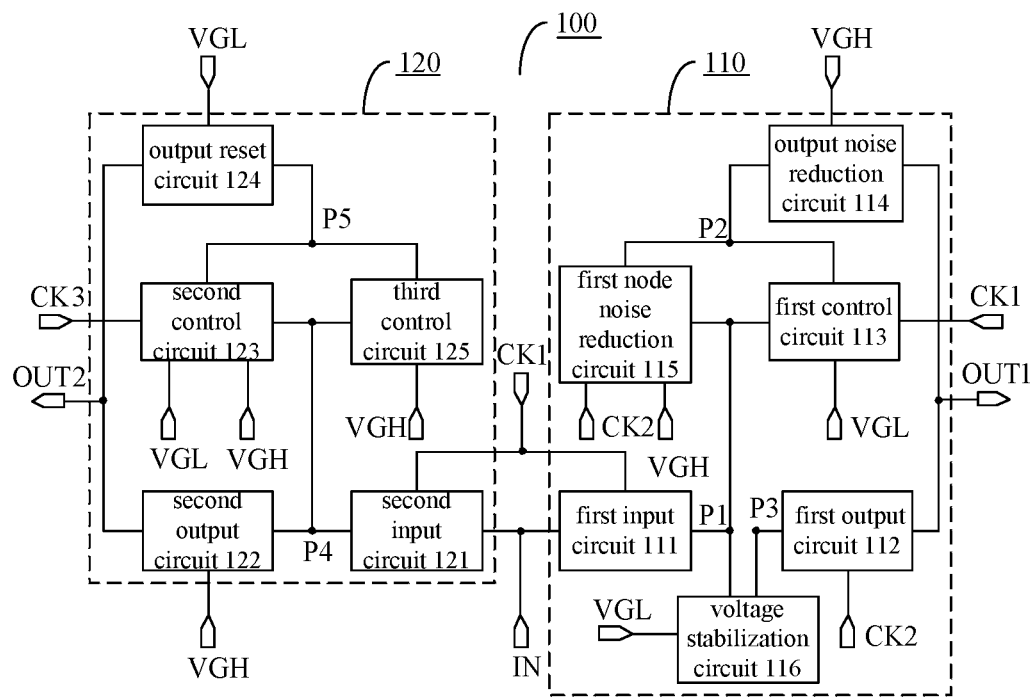
FIG. 5 is a schematic block diagram of another example of the shift register unit as shown in FIG. 3.

FIG. 5 is a schematic block diagram of another circuit corresponding to the shift register unit as shown in FIG. 3 provided by an embodiment of the present disclosure. As shown in FIG. 5, based on the shift register unit as shown in FIG. 4, the first shift register sub-unit 110 further includes a voltage stabilization circuit 116. It should be noted that other circuit structures of the shift register unit 100 as shown in FIG. 5 are basically the same as those of the shift register unit 100 as shown in FIG. 4, and details are not repeated herein.

As shown in FIG. 5, the voltage stabilization circuit 116 is connected to the first node P1 and the third node P3, and is configured to stabilize the voltage of the third node P3. For example, in this example, the first output circuit 112 is connected to the third node P3 and is configured to output the first output signal to the first output terminal OUT1 under the control of a level of the third node P3, that is, the first output circuit 112 is connected to the first node P1 through the voltage stabilization circuit 116. For example, in some examples, the voltage stabilization circuit 116 is connected to the first node P1, the third node P3, and the first voltage terminal VGL or a separately provided voltage terminal (e.g., a low voltage terminal), and is configured to be always turned on under the control of the first voltage terminal VGL or a low voltage provided by the separately provided voltage terminal, thereby electrically connecting the first node P1 to the third node P3 to maintain the level of the third node P3.

It should be noted that the first shift register sub-unit 110 and the second shift register sub-unit 120 are not limited to the above-mentioned circuit structures, and may also be other conventional circuit structures in the art, as long as it can be satisfied that the corresponding output signals are output at the first output terminal OUT1 and the second output terminal OUT2, respectively, and the embodiments of the present disclosure are not limited thereto.

It should be noted that the "active level" of the shift register unit provided in the embodiments of the present disclosure refers to a level that enables the operated transistors included in the shift register unit to be turned on, accordingly, "inactive level" of the shift register unit provided in the embodiments of the present disclosure refers to a level that cannot enable the operated transistors included in the shift register unit to be turned on (that is, the operated transistors are turned off). Depending on factors, such as the type (N-type or P-type) of transistor in the circuit structure of the shift register unit, the active level may be higher or lower than the inactive level. For example, in the embodiment of the present disclosure, in a case where respective transistors are P-type transistors, the active level is a low level and the inactive level is a high level.

Figure 6:
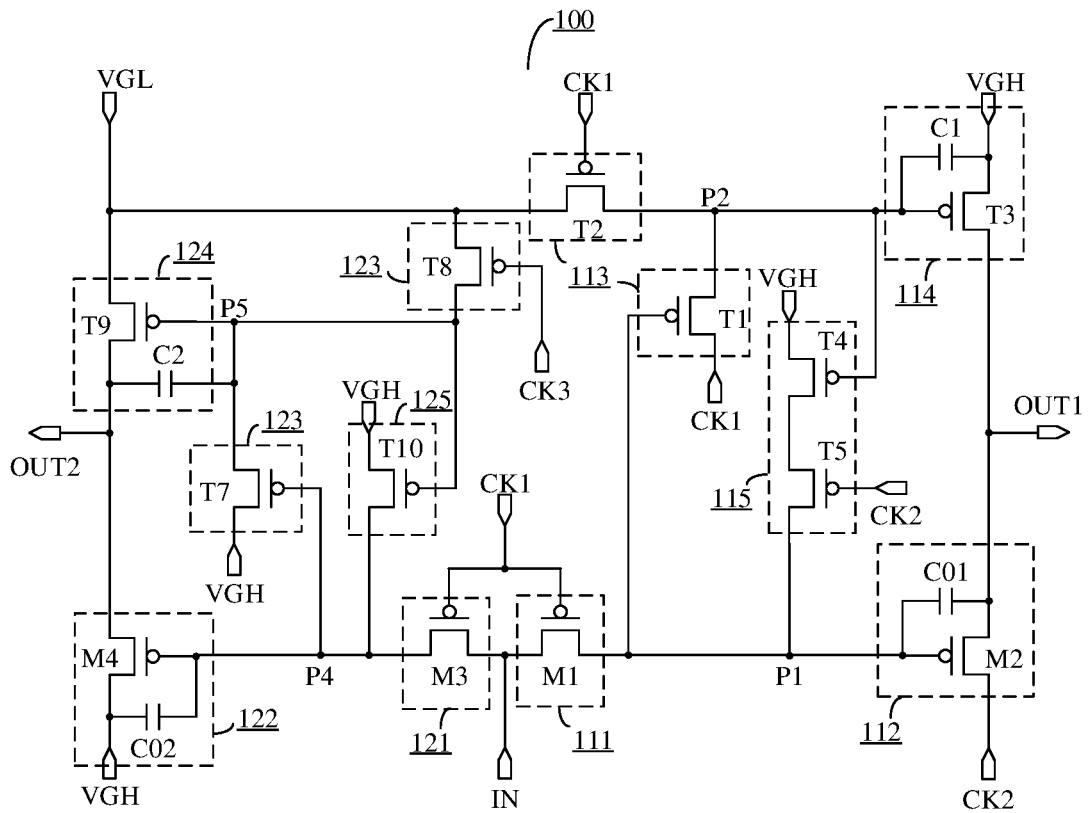
FIG. 6 is a schematic diagram of a circuit structure of a specific implementation example of the shift register unit as shown in FIG. 4.

FIG. 6 is a schematic diagram of a circuit structure of a specific implementation example of the shift register unit as shown in FIG. 4. As shown in FIG. 6, the shift register unit 100 includes a first input transistor M1, a first output transistor M2, a second input transistor M3, a second output transistor M4, first to tenth transistors T1-T10, and further includes a first storage capacitor C01, a second storage capacitor C02, a first capacitor C1, and a second capacitor C2. It should be noted that the following descriptions are described by taking a case that each transistor is a P-type transistor as an example, but this case does not constitute a limitation on the embodiments of the present disclosure.

As shown in FIG. 6, the first input circuit 111 may be implemented as the first input transistor M1. A gate electrode of the first input transistor M1 is connected to the first clock signal terminal CK1 to receive the first clock signal, a first electrode of the first input transistor M1 is connected to the input terminal IN to receive the input signal, and a second electrode of the first input transistor M1 is connected to the first node P1. In a case where the first clock signal provided by the first clock signal terminal CK1 is at an active level (for example, a low level), the first input transistor M1 is turned on, so as to connect the first node P1 to the input terminal IN, so that the level of the first node P1 is the same as the level of the input signal provided by the input terminal IN (both of which are high level or the same low level).

As shown in FIG. 6, the first output circuit 112 may be implemented as the first output transistor M2 and the first storage capacitor C01. A gate electrode of the first output transistor M2 is connected to the first node P1, a first electrode of the first output transistor M2 is connected to the first output terminal OUT1, and a second electrode of the first output transistor M2 is connected to a second clock signal terminal CK2 to receive the second clock signal; a first terminal of the first storage capacitor C01 is connected to the gate electrode of the first output transistor M2, and a second terminal of the first storage capacitor C01 is connected to the first electrode of the first output transistor M2. In a case where the first node P1 is at an active level (for example, a low level), the first output transistor M2 is turned on, the first output terminal OUT1 is connected to the second clock signal terminal CK2, so that the second clock signal provided by the second clock signal terminal CK2 servers as the first output signal and is output at the first output terminal OUT1. The first storage capacitor C01 is used to store the level (low level or high level) of the first node P1, and is used to control the first output transistor M2 to remain turned on or off in a subsequent phase.

As shown in FIG. 6, the first control circuit 113 may be implemented as the first transistor T1 and the second transistor T2. A gate electrode of the first transistor T1 is connected to the first node P1, a first electrode of the first transistor T1 is connected to the first clock signal terminal CK1 to receive the first clock signal, and a second electrode of the first transistor T1 is connected to the second node P2; a gate electrode of the second transistor T2 is connected to the first clock signal terminal CK1 to receive the first clock signal, a first electrode of the second transistor T2 is connected to a first voltage terminal VGL to receive the first voltage, and a second electrode of the second transistor T2 is connected to the second node P2. In a case where the first node P1 is at an active level (for example, a low level), the first transistor T1 is turned on, the second node P2 is connected to the first clock signal terminal CK1, so that the level of the second node P2 is consistent with the level of the first clock signal provided by the first clock signal terminal CK1 (both of which are high level or low level); in a case where the first clock signal provided by the first clock signal terminal CK1 is at an active level (a low level), the second transistor T2 is turned on, so as to connect the second node P2 to the first voltage terminal VGL, thereby charging (for example, pulling down) the second node P2.

As shown in FIG. 6, the output noise reduction circuit 114 may be implemented as a third transistor T3 and a first capacitor C1. A gate electrode of the third transistor T3 is connected to the second node P2, a first electrode of the third transistor T3 is connected to a second voltage terminal VGH to receive the second voltage, and a second electrode of the third transistor T3 is connected to the first output terminal OUT1; and a first terminal of the first capacitor C1 is connected to the second node P2, and a second terminal of the first capacitor C1 is connected to the first electrode of the third transistor T3. In a case where the second node P2 is at an active level (for example, a low level), the third transistor T3 is turned on, so that the first output terminal OUT1 is connected to the second voltage terminal VGH, so as to output the second voltage provided by the second voltage terminal VGH at the first output terminal OUT1, thereby performing noise reduction on the first output terminal OUT1. The first capacitor C1 is used to store the level (low level or high level) of the second node P2, and is used to control the third transistor T3 to remain turned on or off in a subsequent phase.

As shown in FIG. 6, the first node noise reduction circuit 115 may be implemented as a fourth transistor T4 and a fifth transistor T5. A gate electrode of the fourth transistor T4 is connected to the second node P2, a first electrode of the fourth transistor T4 is connected to the second voltage terminal VGH to receive the second voltage, and a second electrode of the fourth transistor T4 is connected to a first electrode of the fifth transistor T5; and a gate electrode of the fifth transistor T5 is connected to the second clock signal terminal CK2 to receive the second clock signal, and a second electrode of the fifth transistor T5 is connected to the first node P1. In a case where the second node P2 and the second clock signal provided by the second time signal terminal CK2 are both at an active level (for example, a low level), the fourth transistor T4 and the fifth transistor T5 are turned on at the same time, so that the first node P1 is connected to the second voltage terminal VGH, thereby transmitting the second voltage (high voltage) provided by the second voltage terminal VGH to the first node P1, thereby performing noise reduction on the first node P1.

As shown in FIG. 6, the second input circuit 121 may be implemented as a second input transistor M3. A gate electrode of the second input transistor M3 is connected to the first clock signal terminal CK1 to receive the first clock signal, a first electrode of the second input transistor M3 is connected to the input terminal IN to receive the input signal, and a second electrode of the second input transistor M3 is connected to the fourth node P4. In a case where the first clock signal provided by the first clock signal terminal CK1 is at an active level (for example, a low level), the second input transistor M3 is turned on, the fourth node P4 is connected to the input terminal IN, so that the level of the fourth node P4 is consistent with the level of the input signal provided by the input terminal IN (both of which are high level or the same low level).

As shown in FIG. 6, the second output circuit 122 may be implemented as a second output transistor M4 and a second storage capacitor C02. A gate electrode of the second output transistor M4 is connected to the fourth node P4, a first electrode of the second output transistor M4 is connected to the second voltage terminal VGH to receive the second voltage, and a second electrode of the second output transistor M4 is connected to the second output terminal OUT2; and a first terminal of the second storage capacitor C02 is connected to the gate electrode of the second output transistor M4, and a second terminal of the second storage capacitor C02 is connected to the first electrode of the second output transistor M4. In a case where the fourth node P4 is at an active level (for example, a low level), the second output transistor M4 is turned on, the second output terminal OUT1 is connected to the second voltage terminal VGH, so that the second voltage provided by the second voltage terminal VGH servers as the second output signal and is output at the second output terminal OUT2. The second storage capacitor C02 is used to store the level (low level or high level) of the fourth node P4, and is used to control the second output transistor M4 to remain turned on or off in a subsequent phase.

As shown in FIG. 6, the second control circuit 123 may be implemented as a seventh transistor T7 and an eighth transistor T8. A gate electrode of the seventh transistor T7 is connected to the fourth node P4, a first electrode of the seventh transistor T7 is connected to the second voltage terminal VGH to receive the second voltage, and a second electrode of the seventh transistor T7 is connected to the fifth node P5; and a gate electrode of the eighth transistor T8 is connected to the third clock signal terminal CK3 to receive the third clock signal, a first electrode of the eighth transistor T8 is connected to the first voltage terminal VGL to receive the first voltage, and a second electrode of the eighth transistor T8 is connected to the fifth node P5. In a case where the fourth node P4 is at an active level (for example, a low level), the seventh transistor T7 is turned on, thereby connecting the fifth node P5 to the second voltage terminal VGH, so that the level of the fifth node P5 is consistent with the level of the second voltage provided by the second voltage terminal VGH, thereby charging (for example, pulling down) the fifth node P5 to pull up the level of the fifth node P5; and in a case where the third clock signal provided by the third clock signal terminal CK3 is at an active level (for example, a low level), the fifth node P5 is connected to the first voltage terminal VGL to discharge (for example, pull up) the fifth node P5 to pull down the level of the fifth node P5. For example, during the operation process, the seventh transistor T7 and the eighth transistor T8 are not turned on at the same time, so as to avoid causing the level of the fifth node P5 not to be an active level.

As shown in FIG. 6, the output reset circuit 124 may be implemented as a ninth transistor T9 and a second capacitor C2. A gate electrode of the ninth transistor T9 is connected to the fifth node P5, a first electrode of the ninth transistor T9 is connected to the second output terminal OUT2, and a second electrode of the ninth transistor T9 is connected to the first voltage terminal VGL to receive the first voltage; and a first terminal of the second capacitor C2 is connected to the fifth node P5, and a second terminal of the second capacitor C2 is connected to the first electrode of the ninth transistor T9. In a case where the fifth node P5 is at an active level (for example, a low level), the ninth transistor T9 is turned on, the second output terminal OUT2 is connected to the first voltage terminal VGL, so that the first voltage provided by the first voltage terminal VGL is output at the second output terminal OUT2, thereby resetting the second output terminal OUT2. The second capacitor C2 is used to store the level (low level or high level) of the fifth node P5, and is used to control the ninth transistor T9 to be turned on or off in a subsequent phase.

For example, as shown in FIG. 6, the third control circuit 125 may be implemented as a tenth transistor T10. A gate electrode of the tenth transistor T10 is connected to the fifth node P5, a first electrode of the tenth transistor T10 is connected to the second voltage terminal VGH to receive the second voltage, and a second electrode of the tenth transistor T10 is connected to the fourth node P4. In a case where the fifth node P5 is at an active level (for example, a low level), the tenth transistor T10 is turned on, the fourth node P4 is connected to the second voltage terminal VGH, so that the level of the fourth node P4 is consistent with the level of the second voltage provided by the second voltage terminal VGH, thereby pulling up the level of the fourth node P4.

Figure 7:
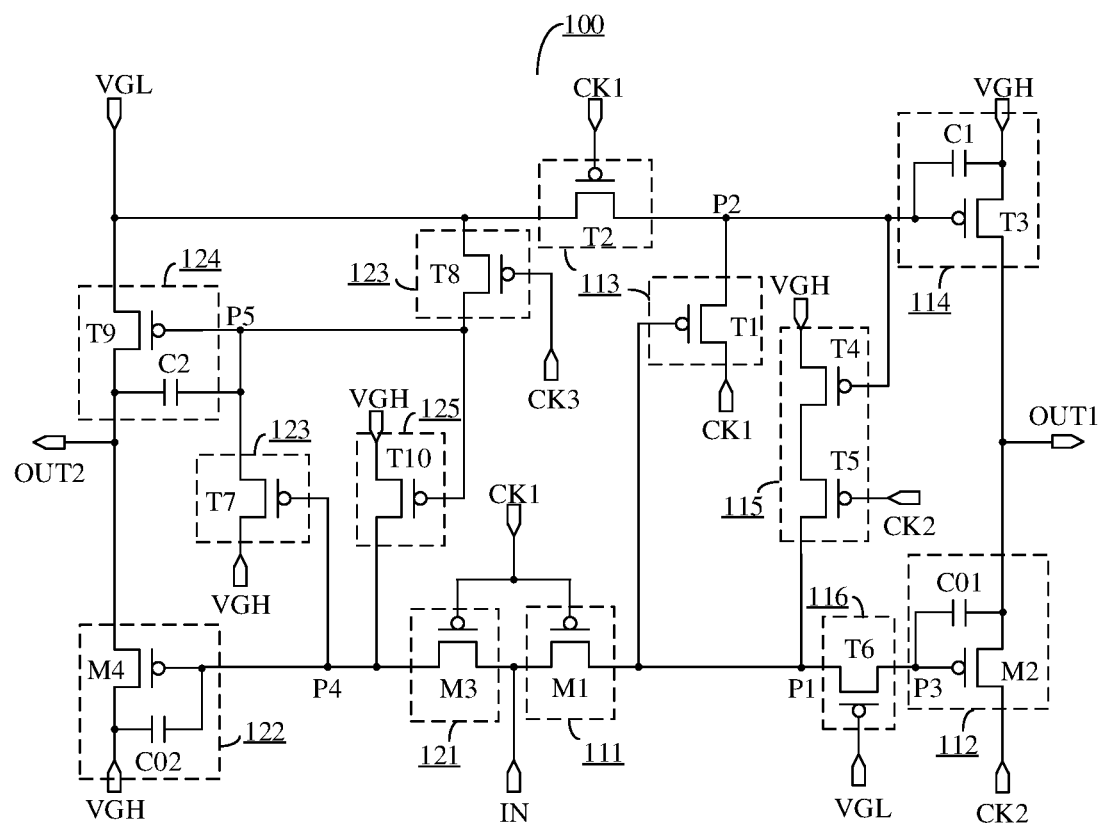
FIG. 7 is a schematic diagram of a circuit structure of a specific implementation example of the shift register unit as shown in FIG. 5.

FIG. 7 is a schematic diagram of a circuit structure of a specific implementation example of the shift register unit as shown in FIG. 5. As shown in FIG. 7, based on the shift register unit as shown in FIG. 6, the shift register unit 100 further includes a sixth transistor T6 that implements the voltage stabilization circuit 116. It should be noted that other circuit structures of the shift register unit 100 as shown in FIG. 7 are basically the same as those in the shift register unit 100 as shown in FIG. 6, and details are not repeated here.

As shown in FIG. 7, a gate electrode of the sixth transistor T6 is connected to the first voltage terminal VGL to receive the first voltage, a first electrode of the sixth transistor T6 is connected to the first node P1, and a second electrode of the sixth transistor T6 is connected to the third node P3 and the gate electrode of the first output transistor M2. For example, the sixth transistor T6 is always turned on under control of the first voltage provided by the first voltage terminal VGL, so that the third node P3 is connected to the first node P1 through the sixth transistor T6. In a case where the level of the third node P3 is pulled down twice, the level of the first node P1 will not be pulled down twice, so that the level of the third node P3 can be prevented from leaking through the first input transistor M1, the first transistor T1, and the fifth transistor T5, which are connected to the first node P1, and simultaneously the stress on the first transistor T1 by the level of the third node P3 can also be reduced, which can help to maintain the level of the third node P3, so that the first output transistor M2 can be fully turned on during the output phase.

For example, the above-mentioned circuit structure of the shift register unit can achieve a common output of a plurality of row driving signals, such as a scan signal and a light-emitting control signal, which is conducive to reducing the number of thin film transistors and improving the stability of the gate driving circuit including the shift register units, moreover, in the above circuit, various ports can be shared to reduce the complexity of wiring, which is conducive to achieving the narrow frame design of the display panel.

It should be noted that, in the embodiments of the present disclosure, capacitors (for example, the first storage capacitor C01, the second storage capacitor C02, the first capacitor C1, and the second capacitor C2) may be capacitance devices manufactured through a process, for example, by manufacturing special capacitance electrodes to achieve a capacitance device, various electrodes of the capacitor can be implemented by a metal layer, a semiconductor layer (such as doped polysilicon), etc., in addition, the capacitors can also be parasitic capacitors between various devices, and can be achieved by the transistors itself and other devices and wiring. The connection manner of the capacitors is not limited to the manner described above, and may be other applicable connection manners as long as the levels of the corresponding nodes can be stored.

In the embodiments of the present disclosure, for example, in a case where each circuit is implemented as N-type transistors, the term "pull-up" means charging a node or an electrode of a transistor so as to raise an absolute value of the level of the node or the electrode, thereby implementing an operation (e.g., turn-on) of the corresponding transistor; the term "pull-down" means discharging a node or an electrode of a transistor so as to decrease an absolute value of the level of the node or the electrode, thereby implementing an operation (e.g., turn-off) of the corresponding transistor.

For another example, in a case where each circuit is implemented as P-type transistors, the term "pull-up" means discharging a node or an electrode of a transistor so as to decrease an absolute value of the level of the node or the electrode, thereby implementing the operation (e.g., turn-on) of the corresponding transistor; the term "pull-down" means charging a node or an electrode of a transistor so as to raise an absolute value of the level of the node or the electrode, thereby implementing the operation (e.g., turn-off) of the corresponding transistor.

It should be noted that in the description of each embodiment of the present disclosure, the first node P1, the second node P2, the third node P3, the fourth node P4, and the fifth node P5 do not indicate actual components, but rather indicate convergence points of related electrical connections in a circuit diagram.

It should be noted that, transistors used in the embodiments of the present disclosure may be thin film transistors, field effect transistors, or other switching devices with the like characteristics and the embodiments of the present disclosure are described by taking thin film transistors as an example. A source electrode and a drain electrode of the transistor used herein may be symmetrical in structure, so a source electrode and a drain electrode of the transistor may have no difference in structure. In the embodiments of the present disclosure, in order to distinguish two electrodes of the transistor apart from a gate electrode, one of the two electrodes is directly referred to as a first electrode, and the other of the two electrodes is referred to as a second electrode.

In addition, the transistors in the embodiments of the present disclosure are described by taking P-type transistors as an example, in this case, the first electrode of the transistor is a source electrode and the second electrode is a drain electrode. It should be noted that the present disclosure includes but is not limited thereto. For example, one or more transistors in the shift register unit 100 provided by the embodiment of the present disclosure may also be an N-type transistor, in this case, the first electrode of the transistor is a drain electrode, and the second electrode is a source electrode, so long as that various electrodes of the selected-type transistor are correspondingly connected with the electrodes of the corresponding transistor in the embodiment of the present disclosure, and the corresponding voltage terminals provide the corresponding high voltages or low voltages. In a case where N-type transistors are adopted, Indium Gallium Zinc Oxide (IGZO) can be used as an active layer of the thin film transistor, compared with adopting Low Temperature Poly Silicon (LTPS) or amorphous silicon (such as hydrogenated amorphous silicon) as the active layer of the thin film transistor, a size of the transistor with Indium Gallium Zinc Oxide as the active layer can be effectively reduced, and leakage current can be prevented.

Figure 8:
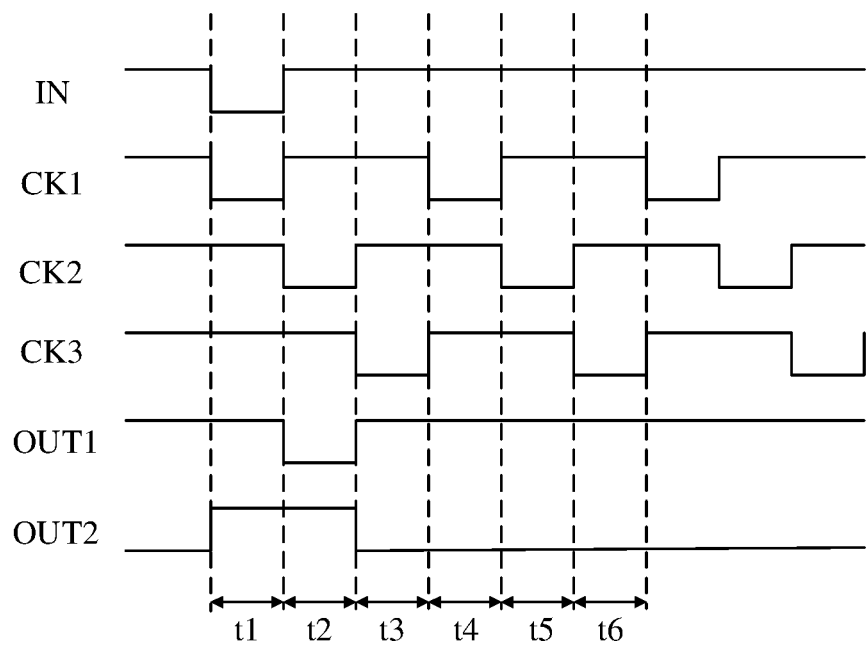
FIG. 8 is a signal timing diagram of a shift register unit during operation provided by some embodiments of the present disclosure.

FIG. 8 is a signal timing diagram of a shift register unit during operation according to some embodiments of the present disclosure. The working principle of the shift register unit 100 according to the embodiment of the present disclosure will be described below with reference to the signal timing diagram as shown in FIG. 8. It should be noted that the level of the potential in the signal timing diagram as shown in FIG. 8 is only schematic, and does not represent a real potential value or a relative ratio. Corresponding to the embodiment of the present disclosure, a low level signal corresponds to a turn-on signal of a P-type transistor, and a high level signal corresponds to a turn-off signal of the P-type transistor.

For example, the following embodiments are described by taking the circuit structure of the shift register unit as shown in FIG. 7 as an example, and the working principle of the shift register unit 100 is as follows.

In a first phase t1, the input terminal IN provides a low level, the first clock signal terminal CK1 provides a low level, the second clock signal terminal CK2 provides a high level, and the third clock signal terminal CK3 provides a high level. The first input transistor M1 is turned on under control of the low level provided by the first clock signal terminal CK1, thereby outputting the low level provided by the input terminal IN to the first node P1 and the third node P3, so that the first node P1 and the third node P3 are charged to a first low level, and the first level of the third node P3 is stored by the first storage capacitor C01; and the first output transistor M2 is turned on under control of the first low level of the third node P3, thereby outputting the high level provided by the second clock signal terminal CK2 to the first output terminal OUT1, that is, the first output terminal OUT1 outputs a high level.

In this phase, the second input transistor M3 is turned on under control of the low level provided by the first clock signal terminal CK1, and the low level provided by the input terminal IN is output to the fourth node P4, so that the fourth node P4 is charged to the first low level and stored by the second storage capacitor C02; and the second output transistor M4 is turned on under control of the first low level of the fourth node P4, thereby outputting a high voltage provided by the second voltage terminal VGH to the second output terminal OUT2. For example, the high level output from the second output terminal OUT2 is the light-emitting control signal EMI[n] as shown in FIG. 2.

In addition, in this phase, the first transistor T1 is turned on under control of the level of the first node P1, and the second transistor T2 is turned on under control of the low level provided by the first clock signal terminal CK1, so that the second node P2 is connected to the first voltage terminal VGL and the first clock signal terminal CK1, thereby pulling down the second node P2 to a low level and storing the low level in the first capacitor C1; under the control of the low level of the second node P2, the third transistor T3 is turned on, and the high level provided by the second voltage terminal VGH is also output to the first output terminal OUT1 to perform noise reduction on the first output terminal OUT1.

At the same time, in this phase, the seventh transistor T7 is turned on under control of the first low level of the fourth node P4, so that the fifth node P5 is connected to the second voltage terminal VGH, thereby pulling up the fifth node P5 to a high level. So that the ninth transistor T9 is turned off under control of the high level of the fifth node P5, thereby ensuring that the second output terminal OUT2 normally outputs a high level as, for example, the light-emitting control signal for driving the pixel circuit 10 as shown in FIG. 1.

In a second phase t2, the input terminal IN provides a high level, the first clock signal terminal CK1 provides a high level, the second clock signal terminal CK2 provides a low level, and the third clock signal terminal CK3 provides a high level. The first input transistor M1 is turned off under control of the high level provided by the first clock signal terminal CK1, the third node P3 is further pulled down to a second low level due to the bootstrap effect of the capacitor, the first output transistor M2 is turned on under the control of the second low level of the third node P3, thereby outputting the low level provided by the second clock signal terminal CK2 to the first output terminal OUT1, for example, the low level output from the first output terminal OUT1 can be used as the first scan signal SN[n] as shown in FIG. 2.

In this phase, the second input transistor M3 is turned off under control of the high level provided by the first clock signal terminal CK1, the fourth node P4 is further pulled down to the second low level due to the bootstrap effect of the capacitor, the second output transistor M4 is turned on under control of the second low level of the fourth node P4, thereby outputting the high voltage provided by the second voltage terminal VGH to the second output terminal OUT2. For example, the high level output from the second output terminal OUT2 is the light-emitting control signal EMI[n] as shown in FIG. 2.

In addition, in this phase, the first transistor T1 is turned on under control of the level of the first node P1, so that the second node P2 is connected to the first clock signal terminal CK1, the high level provided by the first clock signal terminal CK1 charges the second node P2 to a high level, so that the third transistor T3 is turned off, thereby ensuring the normal output of the first output circuit 112.

In a third phase t3, the input terminal IN provides a high level, the first clock signal terminal CK1 provides a high level, the second clock signal terminal CK2 provides a high level, and the third clock signal terminal CK3 provides a low level. The first input transistor M1 is turned off under control of the high level provided by the first clock signal terminal CK1, the third node P3 is maintained at the second low level due to the storage effect of the first storage capacitor C01, the first output transistor M2 is turned on under the control of the second low level of the third node P3, thereby outputting the high level provided by the second clock signal terminal CK2 to the first output terminal OUT1; the eighth transistor T8 is turned on under control of the low level provided by the third clock signal terminal CK3, and the low voltage provided by the first output terminal VGL is outputted to the fifth node P5, thereby pulling down the level of the fifth node P5 and storing the low level of the fifth node P5 in the second capacitor C2; the ninth transistor T9 is turned on under control of the low level of the fifth node P5, and the low voltage provided by the first voltage terminal VGL is outputted to the second output terminal OUT2, thereby resetting the second output terminal OUT2; and the tenth transistor T10 is turned on under the control of the low level of the fifth node P5, and the high voltage provided by the second voltage terminal VGH is outputted to the fourth node P4, thereby charging the level of the fourth node P4 to a high level and storing the high level of the fourth node P4 in the second storage capacitor C02, the second output transistor M4 is turned off under control of the high level of the fourth node P4 to prevent the second output circuit 122 from outputting in a non-output phase.

In a fourth phase t4, the input terminal IN provides a high level, the first clock signal terminal CK1 provides a low level, the second clock signal terminal CK2 provides a high level, and the third clock signal terminal CK3 provides a high level. The first input transistor M1 is turned on under control of the low level provided by the first clock signal terminal CK1, and the high level provided by the input terminal IN is outputted to the first node P1 and the third node P3, so that the first node P1 and the third node P3 are charged to a high level, and the first storage capacitor C01 stores the high level of the third node P3; the first output transistor M2 is turned off under control of the high level of the third node P3, thereby avoiding erroneous output; the second transistor T2 is turned on under control of the low level provided by the first clock signal terminal CK1, the low voltage provided by the first voltage terminal VGL is outputted to the second node P2, so as to pull down the second node P2 to a low level; the third transistor T3 is turned on under control of the low level of the second node P2, and the high voltage provided by the second voltage terminal VGH is outputted to the first output terminal OUT1, thereby performing noise reduction on the first output terminal OUT1 to avoid erroneous output of the first output terminal OUT1.

In this phase, the fifth node P5 is maintained at a low level under the storage effect of the second capacitor C2, the ninth transistor T9 outputs the low voltage provided by the first voltage terminal VGL to the second output terminal OUT2 under control of the low level of the fifth node P5, that is, the second output terminal OUT2 maintains to output a low level to achieve to reset the second output terminal OUT2.

In addition, in this phase, the second input transistor M3 is turned on under control of the low level provided by the first clock signal terminal CK1, the high level provided by the input terminal IN is outputted to the fourth node P4, the tenth transistor T10 is turned on under the control of the level of the fifth node P5, thereby connecting the second voltage terminal VGH to the fourth node P4 to further pull up the level of the fourth node P4, thus ensuring that in the non-output phase the second output circuit 122 is turned off to avoid erroneous output.

In a fifth phase t5, the input terminal IN provides a high level, the first clock signal terminal CK1 provides a high level, the second clock signal terminal CK2 provides a low level, and the third clock signal terminal CK3 provides a high level. The second node P2 is maintained at a low level under the storage effect of the first capacitor C1, the third transistor T3 is turned on under control of the low level of the second node P2, and the high voltage provided by the second voltage terminal VGH is outputted to the first output terminal OUT1, that is, the first output terminal OUT1 maintains to output a high level; the fifth node P5 is maintained at a low level under the storage effect of the second capacitor C2, the ninth transistor T9 outputs the low voltage provided by the first voltage terminal VGL to the second output terminal OUT2 under the control of the low level of the fifth node P5, that is, the second output terminal OUT2 maintains to output a low level.

In addition, in this phase, the fourth transistor T4 is turned on under the control of the second node P2, the fifth transistor T5 is turned on under the control of the low level provided by the second clock signal terminal CK2, so that the first node P1 is connected to the third node P3 and the second voltage terminal VGH to charge the first node P1 to a high level, so that the first output circuit 112 is turned off, thereby avoiding erroneous output of the first output terminal OUT1 in the non-output phase.

In a sixth phase t6, the input terminal IN provides a high level, the first clock signal terminal CK1 provides a high level, the second clock signal terminal CK2 provides a high level, and the third clock signal terminal CK3 provides a low level. The second node P2 is maintained at a low level under the storage effect of the first capacitor C1, the third transistor T3 is turned on under the control of the low level of the second node P2, the high voltage provided by the second voltage terminal VGH is outputted to the first output terminal OUT1, so as to maintain the high level output from the first output terminal OUT1, thereby achieving to perform noise reduction on the first output terminal OUT1.

In this phase, the eighth transistor T8 is turned on under control of the low level provided by the third clock signal terminal CK3, and the low level provided by the first voltage terminal VGL is outputted to the fifth node P5 to maintain the low level of the fifth node P5; the ninth transistor T9 outputs the low voltage provided by the first voltage terminal VGL to the second output terminal OUT2 under control of the low level of the fifth node P5, so that the second output terminal OUT2 maintains to output a low level.

It should be noted that after the sixth phase t6, the fourth phase t4 to the sixth phase t6 will be repeated until the input terminal IN provides a low level again, and similar descriptions are not repeated here again.

It should be noted that, because the voltage stabilization circuit 116 is always turned on, the sixth transistor T6 (the voltage stabilization circuit 116) is always in a turn-on state under the control of the low voltage provided by the first voltage terminal VGL. In the first phase t1, the first node P1 is at a first low level; in the second phase t2, due to the bootstrap effect of the first storage capacitor C01, the third node P3 connected to the first terminal of the first storage capacitor C01 is further pulled down to a second low level, while the first node P1 still remains at the first low level, so that the sixth transistor T6 can prevent the level of the third node P3 from leaking through the first input transistor M1, the first transistor T1, and the fifth transistor T5. At the same time, the stress caused by the second low level of the third node P3 on the first transistor T1 can be reduced, and the service life of the first transistor T1 can be extended.

It should be noted that the duty cycles of the active levels (low level) of the clock signals provided by the first clock signal terminal CK1, the second clock signal terminal CK2, and the third clock signal terminal CK3 as shown in FIG. 8 are all ⅓, which is only exemplary, and other suitable duty cycles may be selected, for example, the duty cycles are less than ⅓, and the embodiments of the present disclosure do not limit the duty cycles. The duty cycles of the active levels of the clock signals provided by the three clock signal terminals may be the same or different, as long as the shift register unit can achieve a common output of a plurality of row driving signals, such as a scan signal and a light-emitting control signal, and the embodiments of the present disclosure are not limited thereto.

Technical effects of the driving method for driving the shift register unit provided by the embodiments of the present disclosure may refer to the corresponding description of the shift register unit 100 in the foregoing embodiment, and details are not described herein again.

Figure 9:
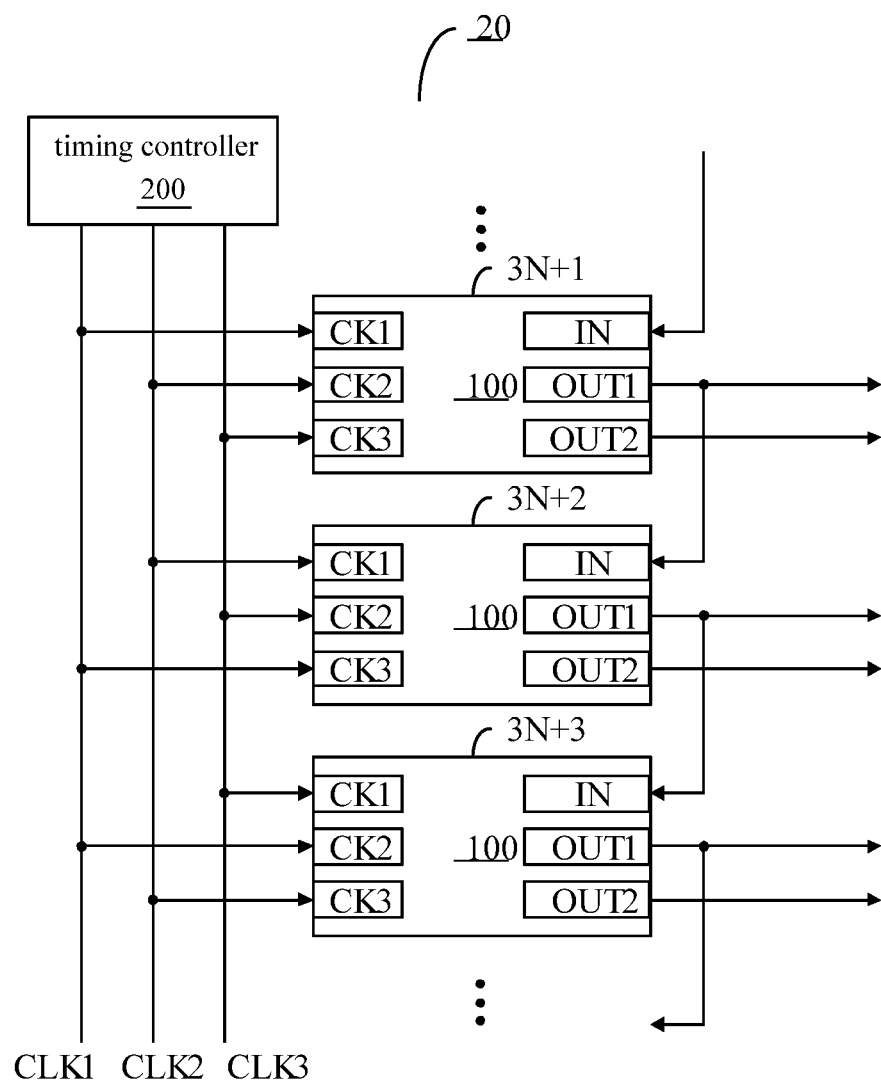
FIG. 9 is a schematic diagram of a gate driving circuit provided by some embodiments of the present disclosure.

At least one embodiment of the present disclosure also provides a gate driving circuit. FIG. 9 is a schematic diagram of a gate driving circuit provided by some embodiments of the present disclosure. As shown in FIG. 9, the gate driving circuit 20 includes a plurality of shift register units 100 that are cascaded. Any one or more of the shift register units 100 may adopt the structure or a modification of the shift register unit 100 provided by any one of embodiments of the present disclosure, for example, may adopt the shift register unit 100 as shown in FIG. 7.

For example, the gate driving circuit 20 can be directly integrated on the array substrate of the display device by using a semiconductor manufacturing process that is the same as a semiconductor manufacturing process of the thin film transistor, so as to achieve the progressive or interlaced scanning driving function. In the gate driving circuit 20, except for a first stage of shift register unit, an input terminal IN of each remaining stage of shift register unit, other than first stage of shift register unit, is connected to a first output terminal OUT1 of a previous stage of shift register unit. For example, an input terminal IN of the first stage of shift register unit may be configured to receive a trigger signal STV (not shown in the figure).

In the shift register unit provided in the embodiment of the present disclosure, because inside of the shift register unit, the shift register unit can reset the first output terminal OUT1 and the second output terminal OUT2 respectively through the output noise reduction circuit 114 and the output reset circuit 124, there is no need to set separate reset circuits to reset each node and each output terminal of the current stage of shift register unit. Therefore, in the gate driving circuit 20, each current stage of shift register unit (except a last stage of shift register unit) does not need to be connected to a first output terminal OUT1 of a next stage of shift register unit of the current stage of shift register unit to reset each node, the first output terminal OUT1, and the second output terminal OUT2 of the current stage of shift register unit, so that the gate driving circuit provided by the embodiment of the present disclosure can reduce the complexity of wiring and improve the stability of the gate driving circuit.

For example, as shown in FIG. 9, the gate driving circuit 20 further includes a first clock signal line CLK1, a second clock signal line CLK2, and a third clock signal line CLK3. Each shift register unit 100 for cascading further includes the first clock signal terminal CK1, the second clock signal terminal CK2, and the third clock signal terminal CK3. For example, a first clock signal terminal CK1 of a (3N+1)-th (N is an integer greater than or equal to 0) stage of shift register unit is connected to the first clock signal line CLK1, a second clock signal terminal CK2 of the (3N+1)-th stage of shift register unit is connected to the second clock signal line CLK2, and a third clock signal terminal CK3 of the (3N+1)-th stage of shift register unit is connected to the third clock signal line CLK3; a first clock signal terminal CK1 of a (3N+2)-th stage of shift register unit is connected to the second clock signal line CLK2, a second clock signal terminal CK2 of the (3N+2)-th stage of shift register unit is connected to the third clock signal line CLK3, and a third clock signal terminal CK3 of the (3N+2)-th stage of shift register unit is connected to the first clock signal line CLK1; a first clock signal terminal CK1 of a (3N+3)-th stage of shift register unit is connected to the third clock signal line CLK3, a second clock signal terminal CK2 of the (3N+3)-th stage of shift register unit is connected to the first clock signal line CLK1, and a third clock signal terminal CK3 of the (3N+3)-th stage of shift register unit is connected to the second clock signal line CLK2.

It should be noted that serial numbers of the plurality of shift register units are set according to cascaded serial numbers of the plurality of shift register units at electrical angles, and may be the same or different to the serial numbers of the plurality of shift register units in physical space, and the embodiments of the present disclosure are not limited thereto.

For example, as shown in FIG. 9, the gate driving circuit 20 may further include a timing controller 200. For example, the timing controller 200 may be configured to be connected to the first clock signal line CLK1, the second clock signal line CLK2, and the third clock signal line CLK3 to provide clock signals to each shift register unit. For example, the timing of the clock signals provided by the first clock signal line CLK1, the second clock signal line CLK2, and the third clock signal line may use the signal timing as shown in FIG. 8, so as to achieve the function of outputting the scan signals and the light-emitting control signals line by line through the gate driving circuit 20. For example, the timing controller 200 may also be configured to provide a trigger signal STV.

For example, working principle of each stage of the shift register units in the gate driving circuit 20 may refer to the corresponding description of the working principle of the shift register unit provided by the embodiment of the present disclosure, and similar portions are not be repeated here again.

It should be noted that, for each stage of the shift register units, the clock signal received by the first clock signal terminal CK1 of a current stage of shift register unit is used as the first clock signal of the current stage of shift register unit, and the first clock signal may be one of the clock signals provided by the first clock signal line CLK1, the second clock signal line CLK2, and the third clock signal line CLK3. For example, the first clock signal received by the first clock signal terminal CK1 of the (3N+1)-th stage of shift register unit is from the first clock signal line CLK1, the first clock signal received by the first clock signal terminal CK1 of the (3N+2)-th stage of shift register unit is from the second clock signal line CLK2, and the first clock signal received by the first clock signal terminal CK1 of the (3N+3)-th stage of shift register unit is from the third clock signal line CLK3. Similarly, for each stage of the shift register units, the clock signal received by the second clock signal terminal CK2 of the current stage of shift register unit is used as the second clock signal of the current stage of shift register unit, and the clock signal received by the third clock signal terminal CK3 of the current stage of shift register unit is used as the third clock signal of the current stage of shift register unit.

It should be noted that in a case where the gate driving circuit 20 provided by the embodiment of the present disclosure is used to drive a display panel, the gate driving circuit 20 may be disposed on one side of the display panel. For example, the display panel includes a plurality of rows of gate lines, and the first output terminals of the shift register units in the gate driving circuit 20 may be configured to be sequentially connected to the plurality of rows of gate lines for outputting scan signals. For example, the display panel further includes a plurality of rows of second control lines (for example, for transmitting the above-mentioned light-emitting control signals), and the second output terminals of the shift register units in the gate driving circuit 20 may be configured to be sequentially connected to the plurality of rows of second control lines for outputting second control signals (for example, the above-mentioned light-emitting control signals). It should be noted that the gate driving circuit 20 may also be provided on both sides of the display panel to achieve bilateral driving. The embodiment of the present disclosure does not limit the setting manner of the gate driving circuit 20.

Figure 10:
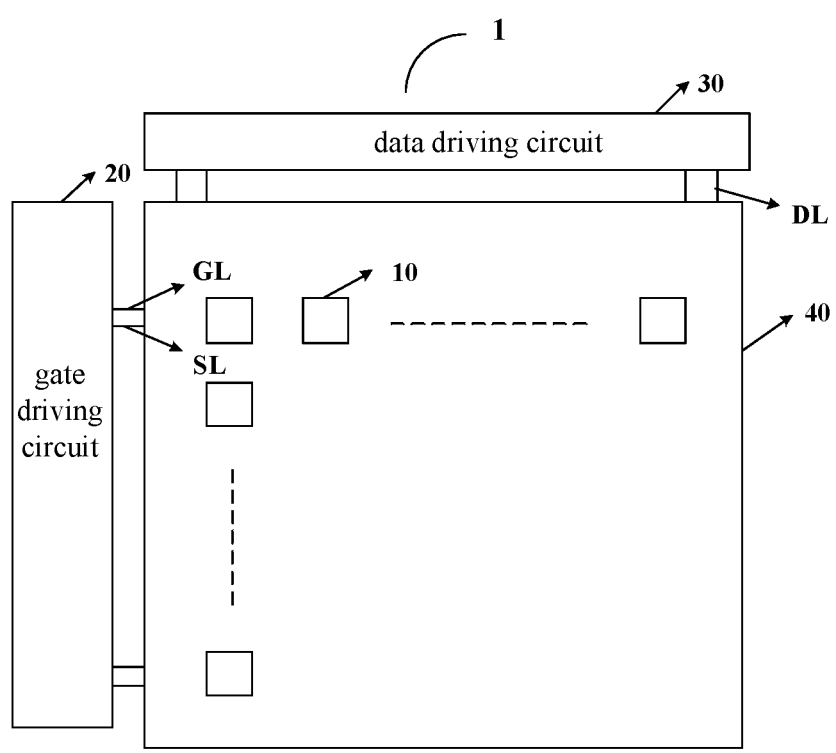
FIG. 10 is a schematic diagram of a display device provided by some embodiments of the present disclosure.

At least one embodiment of the present disclosure also provides a display device 1. As shown in FIG. 10, the display device 1 includes a gate driving circuit 20 provided by the above embodiments of the present disclosure. The display device 1 further includes a display panel 40, the display panel 40 includes a plurality of pixel units arranged in an array, and each of the plurality of pixel units includes a pixel circuit 10, for example, the pixel circuit 10 as shown in FIG. 1. As shown in FIG. 1, in an example, the pixel circuit 10 may include a driving sub-circuit 12, a data writing sub-circuit 11, and a light-emitting control sub-circuit 13. For example, the first output terminal OUT1 of the shift register unit 100 in the gate driving circuit 20 is connected to a control terminal of the data writing sub-circuit 11 of the pixel circuit 10 through a corresponding gate line GL, and is used to provide, for example, the first scan signal SN[n] (n is an integer greater than 1) as shown in FIG. 2; the second output terminal OUT2 of the shift register unit 100 in the gate driving circuit 20 is connected to a control terminal of the light-emitting control sub-circuit 13 of the pixel circuit 10 through a corresponding second control line SL, and is used to provide, for example, the light-emitting control signal EMI[n]. For example, the gate line for providing the first scan signal SN[n] may be connected to the data writing sub-circuits 11 of the pixel circuits in an n-th row; the gate line providing the light-emitting control signal EMI[n] may be connected to the light-emitting control sub-circuits 13 of the pixel circuits in the n-th row.

For example, the display device 1 may further include a data driving circuit 30. The data driving circuit 30 is connected to the data writing sub-circuit of the pixel circuit 10 through a data line DL, and is configured to provide data signals to the pixel array.

It should be noted that the display device 1 in the embodiment may be: a display, an OLED panel, an OLED TV, an electronic paper display device, a mobile phone, a tablet computer, a notebook computer, a digital photo frame, a navigator, or any product or component having a display function. The display device 1 may further include other conventional components, such as a display panel, and the embodiments of the present disclosure are not limited in this aspect.

The technical effect of the display device 1 provided by the embodiments of the present disclosure may refer to the corresponding descriptions of the gate driving circuit 20 in the foregoing embodiments, and details are not described herein again.

It should be noted that, for clarity and conciseness, an entire structure of the display device 1 is not given. In order to achieve the necessary functions of the display device, those skilled in the art may set other structures not shown according to specific application scenarios, and the embodiments of the present disclosure are not limited thereto.

At least one embodiment of the present disclosure also provides a driving method of a shift register unit, and the driving method can be used to drive the shift register unit 100 provided by the embodiments of the present disclosure. For example, the driving method comprises: in response to the input signal, by the first shift register sub-unit 110 of the shift register unit 100, outputting the first output signal at the first output terminal OUT1; and in response to the input signal, by the second shift register sub-unit 120 of the shift register unit 100, outputting the second output signal at the second output terminal OUT1. For example, a pulse portion of the first output signal at least partially overlaps with a pulse portion of the second output signal in time. For example, in an example, the first output signal may be the gate scan signal as shown in FIG. 2, and the second output signal may be the light-emitting control signal as shown in FIG. 2.

The technical effects of the driving method for driving the shift register unit provided by the embodiments of the present disclosure may refer to the corresponding description of the shift register unit 100 in the foregoing embodiment, and details are not described herein again.

For the present disclosure, the following statements should be noted:

(1) The accompanying drawings of the embodiments of the present disclosure involve only the structure(s) in connection with the embodiment(s) of the present disclosure, and other structure(s) can be referred to common design(s).

(2) For the purpose of clarity only, in accompanying drawings for illustrating the embodiment(s) of the present disclosure, the thickness of a layer or area may be enlarged or narrowed, that is, the drawings are not drawn in an actual scale.

(3) In case of no conflict, the embodiments of the present disclosure and the features in the embodiment(s) can be combined with each other to obtain new embodiment(s).

What have been described above are only specific implementations of the present disclosure, the protection scope of the present disclosure is not limited thereto, and the protection scope of the present disclosure should be based on the protection scope of the claims.

What is claimed is:

1. A shift register unit, comprising an input terminal, a first shift register sub-unit, and a second shift register sub-unit;
   wherein the first shift register sub-unit comprises a first output terminal and is connected to the input terminal to receive an input signal, and the first shift register sub-unit is configured to output a first output signal at the first output terminal according to the input signal;
   the second shift register sub-unit comprises a second output terminal and is connected to the input terminal to receive the input signal, and the second shift register sub-unit is configured to output a second output signal at the second output terminal according to the input signal; and
   a pulse portion of the first output signal at least partially overlaps with a pulse portion of the second output signal in time;
   wherein the first shift register sub-unit comprises a first input circuit and a first output circuit,
   the first input circuit is connected to the input terminal and a first node, and is configured to input the input signal to the first node in response to a first clock signal; and
   the first output circuit is connected to the first node and the first output terminal, and is configured to output the first output signal to the first output terminal under control of a level of the first node.

2. The shift register unit according to claim 1, wherein the first input circuit comprises a first input transistor, a gate electrode of the first input transistor is connected to a first clock signal terminal to receive the first clock signal, a first electrode of the first input transistor is connected to the input terminal to receive the input signal, and a second electrode of the first input transistor is connected to the first node;
   the first output circuit comprises a first output transistor and a first storage capacitor, a gate electrode of the first output transistor is connected to a third node, a first electrode of the first output transistor is connected to the first output terminal, and a second electrode of the first output transistor is connected to a second clock signal terminal to receive a second clock signal; and a first terminal of the first storage capacitor is connected to the gate electrode of the first output transistor, and a second terminal of the first storage capacitor is connected to the first electrode of the first output transistor.

3. The shift register unit according to claim 1, wherein the first shift register sub-unit further comprises a first control circuit and an output noise reduction circuit;
   the first control circuit is connected to a second node, and is configured to control a level of the second node in response to the level of the first node and the first clock signal; and
   the output noise reduction circuit is connected to the first output terminal, and is configured to perform noise reduction on the first output terminal under control of the level of the second node.

4. The shift register unit according to claim 3, wherein the first control circuit comprises a first transistor and a second transistor;
   a gate electrode of the first transistor is connected to the first node, a first electrode of the first transistor is connected to a first clock signal terminal to receive the first clock signal, and a second electrode of the first transistor is connected to the second node; and
   a gate electrode of the second transistor is connected to the first clock signal terminal to receive the first clock signal, a first electrode of the second transistor is connected to a first voltage terminal to receive a first voltage, and a second electrode of the second transistors is connected to the second node.

5. The shift register unit according to claim 3, wherein the output noise reduction circuit comprises a third transistor and a first capacitor;
   a gate electrode of the third transistor is connected to the second node, a first electrode of the third transistor is connected to a second voltage terminal to receive a second voltage, and a second electrode of the third transistor is connected to the first output terminal; and
   a first terminal of the first capacitor is connected to the second node, and a second terminal of the first capacitor is connected to the first electrode of the third transistor.

6. The shift register unit according to claim 3, wherein the first shift register sub-unit further comprises a first node noise reduction circuit; and
   the first node noise reduction circuit is connected to the first node and the second node, and is configured to perform noise reduction on the first node under control of the level of the second node and a second clock signal.

7. The shift register unit according to claim 6, wherein the first node noise reduction circuit comprises a fourth transistor and a fifth transistor;
   a gate electrode of the fourth transistor is connected to the second node, a first electrode of the fourth transistor is connected to a second voltage terminal to receive a second voltage, and a second electrode of the fourth transistor is connected to a first electrode of the fifth transistor; and
   a gate electrode of the fifth transistor is connected to a second clock signal terminal to receive the second clock signal, and a second electrode of the fifth transistor is connected to the first node.

8. The shift register unit according to claim 1, wherein the first shift register sub-unit further comprises a voltage stabilization circuit;
   the voltage stabilization circuit is connected to the first node and a third node, and is configured to stabilize a level of the third node; and
   the first output circuit is connected to the third node, and is configured to output the first output signal to the first output terminal under control of the level of the third node.

9. The shift register unit according to claim 8, wherein the voltage stabilization circuit comprises a sixth transistor,
   a gate electrode of the sixth transistor is connected to a first voltage terminal to receive a first voltage, a first electrode of the sixth transistor is connected to the first node, and a second electrode of the sixth transistor is connected to the third node.

10. The shift register unit according to claim 1, wherein the second shift register sub-unit comprises a second input circuit, a second output circuit, a second control circuit, and an output reset circuit;
    the second input circuit is connected to the input terminal and a fourth node, and is configured to input the input signal to the fourth node in response to a first clock signal;
    the second output circuit is connected to the fourth node and the second output terminal, and is configured to output the second output signal to the second output terminal under control of a level of the fourth node;

the second control circuit is connected to the fourth node and a fifth node, and is configured to control a level of the fifth node in response to the level of the fourth node and a third clock signal; and the output reset circuit is connected to the fifth node, and is configured to reset the second output terminal under control of the level of the fifth node.

11. The shift register unit according to claim 10, wherein the second input circuit comprises a second input transistor, a gate electrode of the second input transistor is connected to a first clock signal terminal to receive the first clock signal, a first electrode of the second input transistor is connected to the input terminal to receive the input signal, and a second electrode of the second input transistor is connected to the fourth node;

the second output circuit comprises a second output transistor and a second storage capacitor, a gate electrode of the second output transistor is connected to the fourth node, a first electrode of the second output transistor is connected to a second voltage terminal to receive a second voltage, and a second electrode of the second output transistor is connected to the second output terminal; and a first terminal of the second storage capacitor is connected to the gate electrode of the second output transistor, and a second terminal of the second storage capacitor is connected to the first electrode of the second output transistor.

12. The shift register unit according to claim 10, wherein the second control circuit comprises a seventh transistor and an eighth transistor;

a gate electrode of the seventh transistor is connected to the fourth node, a first electrode of the seventh transistor is connected to a second voltage terminal to receive a second voltage, and a second electrode of the seventh transistor is connected to the fifth node; and a gate electrode of the eighth transistor is connected to a third clock signal terminal to receive the third clock signal, a first electrode of the eighth transistor is connected to a first voltage terminal to receive a first voltage, and a second electrode of the eighth transistor is connected to the fifth node.

13. The shift register unit according to claim 10, wherein the output reset circuit comprises a ninth transistor and a second capacitor;

a gate electrode of the ninth transistor is connected to the fifth node, a first electrode of the ninth transistor is connected to the second output terminal, and a second electrode of the ninth transistor is connected to a first voltage terminal to receive a first voltage; and a first terminal of the second capacitor is connected to the fifth node, and a second terminal of the second capacitor is connected to the first electrode of the ninth transistor.

14. The shift register unit according to claim 10, wherein the second shift register sub-unit further comprises a third control circuit;

the third control circuit is connected to the fourth node and the fifth node, and is configured to control the level of the fourth node under control of the level of the fifth node.

15. The shift register unit according to claim 14, wherein the third control circuit comprises a tenth transistor;

a gate electrode of the tenth transistor is connected to the fifth node, a first electrode of the tenth transistor is connected to a second voltage terminal to receive a second voltage, and a second electrode of the tenth transistor is connected to the fourth node.

16. The shift register unit according to claim 1, wherein the first shift register sub-unit comprises a first input circuit, a first output circuit, a first control circuit, an output noise reduction circuit, a first node noise reduction circuit, and a voltage stabilization circuit, and the second shift register sub-unit comprises a second input circuit, a second output circuit, a second control circuit, an output reset circuit, and a third control circuit;

the first input circuit comprises a first input transistor, a gate electrode of the first input transistor is connected to a first clock signal terminal to receive the first clock signal, a first electrode of the first input transistor is connected to the input terminal to receive the input signal, and a second electrode of the first input transistor is connected to the first node;

the first output circuit comprises a first output transistor and a first storage capacitor, a gate electrode of the first output transistor is connected to a third node, a first electrode of the first output transistor is connected to the first output terminal, and a second electrode of the first output transistor is connected to a second clock signal terminal to receive a second clock signal; a first terminal of the first storage capacitor is connected to the gate electrode of the first output transistor, and a second terminal of the first storage capacitor is connected to the first electrode of the first output transistor;

the first control circuit comprises a first transistor and a second transistor, a gate electrode of the first transistor is connected to the first node, a first electrode of the first transistor is connected to the first clock signal terminal to receive the first clock signal, and a second electrode of the first transistor is connected to a second node; a gate electrode of the second transistor is connected to the first clock signal terminal to receive the first clock signal, a first electrode of the second transistor is connected to a first voltage terminal to receive a first voltage, and a second electrode of the second transistor is connected to the second node;

the output noise reduction circuit comprises a third transistor and a first capacitor, a gate electrode of the third transistor is connected to the second node, a first electrode of the third transistor is connected to a second voltage terminal to receive a second voltage, and a second electrode of the third transistor is connected to the first output terminal; a first terminal of the first capacitor is connected to the second node, and a second terminal of the first capacitor is connected to the first electrode of the third transistor;

the first node noise reduction circuit comprises a fourth transistor and a fifth transistor, a gate electrode of the fourth transistor is connected to the second node, a first electrode of the fourth transistor is connected to the second voltage terminal to receive the second voltage, and a second electrode of the fourth transistor is connected to a first electrode of the fifth transistor; a gate electrode of the fifth transistor is connected to the second clock signal terminal to receive the second clock signal, and a second electrode of the fifth transistor is connected to the first node;

the voltage stabilization circuit comprises a sixth transistor, a gate electrode of the sixth transistor is connected to the first voltage terminal to receive the first voltage, a first electrode of the sixth transistor is connected to the first node, and a second electrode of the sixth transistor is connected to the third node;

the second input circuit comprises a second input transistor, a gate electrode of the second input transistor is connected to the first clock signal terminal to receive the first clock signal, a first electrode of the second input transistor is connected to the input terminal to receive the input signal, and a second electrode of the second input transistor is connected to a fourth node;

the second output circuit comprises a second output transistor and a second storage capacitor, a gate electrode of the second output transistor is connected to the fourth node, a first electrode of the second output transistor is connected to the second voltage terminal to receive the second voltage, and a second electrode of the second output transistor is connected to the second output terminal; a first terminal of the second storage capacitor is connected to the gate electrode of the second output transistor, and a second terminal of the second storage capacitor is connected to the first electrode of the second output transistor;

the second control circuit comprises a seventh transistor and an eighth transistor, a gate electrode of the seventh transistor is connected to the fourth node, a first electrode of the seventh transistor is connected to the second voltage terminal to receive the second voltage, and a second electrode of the seventh transistor is connected to a fifth node; a gate electrode of the eighth transistor is connected to a third clock signal terminal to receive a third clock signal, a first electrode of the eighth transistor is connected to the first voltage terminal to receive the first voltage, and a second electrode of the eighth transistor is connected to the fifth node;

the output reset circuit comprises a ninth transistor and a second capacitor, a gate electrode of the ninth transistor is connected to the fifth node, a first electrode of the ninth transistor is connected to the second output terminal, and a second electrode of the ninth transistor is connected to the first voltage terminal to receive the first voltage; a first terminal of the second capacitor is connected to the fifth node, and a second terminal of the second capacitor is connected to the first electrode of the ninth transistor; and the third control circuit comprises a tenth transistor, a gate electrode of the tenth transistor is connected to the fifth node, a first electrode of the tenth transistor is connected to the second voltage terminal to receive the second voltage, and a second electrode of the tenth transistor is connected to the fourth node.

17. A gate driving circuit, comprising a plurality of cascaded shift register units according to claim 1,
wherein except for a first stage of shift register unit, an input terminal of each stage of shift register unit, other than the first stage of shift register unit, is connected to a first output terminal of a previous stage of shift register unit.

18. The gate driving circuit according to claim 17, further comprising a first clock signal line, a second clock signal line, and a third clock signal line, each of the shift register units further comprises a first clock signal terminal, a second clock signal terminal, and a third clock signal terminal;
a first clock signal terminal of a (3N+1)-th stage of shift register unit is connected to the first clock signal line, a second clock signal terminal of the (3N+1)-th stage of shift register unit is connected to the second clock signal line, and a third clock signal terminal of the (3N+1)-th stage of shift register unit is connected to the third clock signal line;
a first clock signal terminal of a (3N+2)-th stage of shift register unit is connected to the second clock signal line, a second clock signal terminal of the (3N+2)-th stage of shift register unit is connected to the third clock signal line, and a third clock signal terminal of the (3N+2)-th stage of shift register unit is connected to the first clock signal line;
a first clock signal terminal of a (3N+3)-th stage of shift register unit is connected to the third clock signal line, a second clock signal terminal of the (3N+3)-th stage of shift register unit is connected to the first clock signal line, and a third clock signal terminal of the (3N+3)-th stage of shift register unit is connected to the second clock signal line; and
N is an integer greater than or equal to 0.

19. A display device, comprising the gate driving circuit according to claim 17 and a plurality of pixel units arranged in an array,
wherein each of the plurality of pixel units comprises a pixel circuit, the pixel circuit comprises a data writing sub-circuit, a driving sub-circuit, and a light-emitting control sub-circuit;
the first output terminal of the shift register unit corresponding to the pixel circuit is connected to a control terminal of the data writing sub-circuit, and the second output terminal of the shift register unit corresponding to the pixel circuit is connected to a control terminal of the light-emitting control sub-circuit.

* * * * *